(12) United States Patent
Moertl et al.

(10) Patent No.: US 10,990,537 B1
(45) Date of Patent: Apr. 27, 2021

(54) LOGICAL TO VIRTUAL AND VIRTUAL TO PHYSICAL TRANSLATION IN STORAGE CLASS MEMORY

(71) Applicant: International Business Machines Corporation, Armonk, NY (US)

(72) Inventors: Daniel Frank Moertl, Rochester, MN (US); Damir Anthony Jamsek, Austin, TX (US); Andrew Kenneth Martin, Austin, TX (US); Charalampos Pozidis, Thalwil (CH); Robert Edward Galbraith, Rochester, MN (US); Jeremy T. Ekman, West Concord, MN (US); Abby Harrison, Rochester, MN (US); Gerald Mark Grabowski, Kellogg, MN (US); Steven Norgaard, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/736,547

(22) Filed: Jan. 7, 2020

(51) Int. Cl.
*G06F 12/1009* (2016.01)

(52) U.S. Cl.
CPC .... *G06F 12/1009* (2013.01); *G06F 2212/657* (2013.01)

(58) Field of Classification Search
CPC ................. G06F 12/1009; G06F 2212/657
See application file for complete search history.

(56) References Cited

U.S. PATENT DOCUMENTS

| | | | |
|---|---|---|---|
| 8,219,776 | B2 | 7/2012 | Forhan et al. |
| 9,552,292 | B2 | 1/2017 | Ooba et al. |
| 9,575,690 | B2 | 2/2017 | Burton et al. |
| 9,804,969 | B2 | 10/2017 | Venkumahanti et al. |
| 9,824,023 | B2 | 11/2017 | Lu |
| 10,025,533 | B2 | 7/2018 | Bohn et al. |

(Continued)

FOREIGN PATENT DOCUMENTS

WO    2018031197 A1    2/2018

OTHER PUBLICATIONS

Chang et al.; "Endurance Enhancement of Flash-Memory Storage Systems: An Efficient Static Wear Leveling Design", 14th ACM/IEEE Design Auto. Conf., Jun. 4-8, 2007,pp. 212-217.

(Continued)

*Primary Examiner* — Sean D Rossiter
(74) *Attorney, Agent, or Firm* — Scully, Scott, Murphy & Presser, P.C.

(57) ABSTRACT

A memory system and method for storing data in one or more storage chips includes: one or more memory cards each having a plurality of storage chips, and each chip having a plurality of dies having a plurality of memory cells; a memory controller comprising a translation module, the translation module further comprising: a logical to virtual translation table (LVT) having a plurality of entries, each entry in the LVT configured to map a logical address to a virtual block address (VBA), where the VBA corresponds to a group of the memory cells on the one or more memory cards, wherein each entry in the LVT further includes a write wear level count to track the number of writing operations to the VBA, and a read wear level count to track the number of read operations for the VBA mapped to that LVT entry.

25 Claims, 13 Drawing Sheets

(56) References Cited

U.S. PATENT DOCUMENTS

| | | | |
|---|---|---|---|
| 10,649,672 B1* | 5/2020 | Nishimoto | G06F 3/0652 |
| 2005/0235132 A1 | 10/2005 | Karr et al. | |
| 2009/0222627 A1* | 9/2009 | Reid | G06F 12/0804 |
| | | | 711/135 |
| 2010/0250825 A1 | 9/2010 | Chen et al. | |
| 2013/0151754 A1 | 6/2013 | Post et al. | |
| 2014/0089630 A1 | 3/2014 | Pignatelli | |
| 2015/0186259 A1* | 7/2015 | Thomas | G06F 12/0246 |
| | | | 711/103 |
| 2017/0177497 A1 | 6/2017 | Chun et al. | |
| 2017/0286291 A1* | 10/2017 | Thomas | G06F 12/0253 |
| 2017/0293568 A1 | 10/2017 | Gunnam et al. | |
| 2017/0371559 A1* | 12/2017 | Higgins | G06F 3/0673 |
| 2018/0095690 A1 | 4/2018 | Gates et al. | |
| 2019/0102249 A1 | 4/2019 | Bolkhovitin et al. | |
| 2019/0310959 A1 | 10/2019 | Iyer et al. | |

OTHER PUBLICATIONS

Bjorling et al.; "LightNVM: The Linux Open-Channel SSD Subsystem", FAST'17 15th USENIX Conference on, Feb. 27-Mar. 2, 2017, pp. 359-373.

Microchip et al.; "Creating a Multi-LUN USB Mass Storage Class Device Using the MPLAB® Harmony USB Device Stack", Microchip AN2554, Nov. 8, 2017, pp. 1-58.

Micron et al.; "Wear-Leveling Techniques in NAND Flash Devices", Micron TN-29-42, Oct. 1, 2008, pp. 1-8.

International Search Report dated Mar. 15, 2021 received in a corresponding foreign application, 7 pages.

* cited by examiner

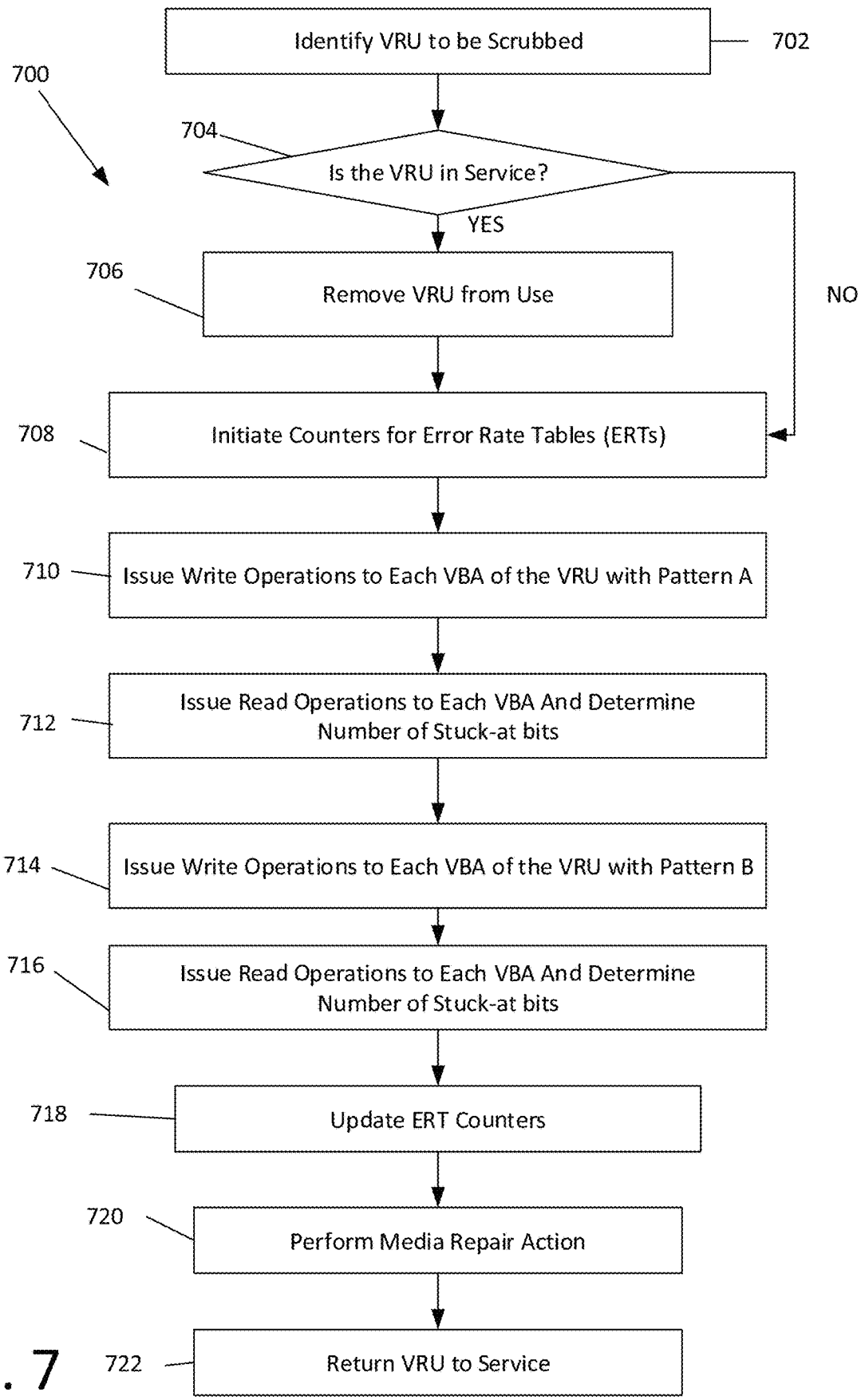

ERT Analysis indicates only bit array repair required

☒ = Stuck bit counts exceed $T_H$ threshold for BAI/beat
▨ = Stuck bit counts exceed $T_L$ threshold for BAI/beat
☐ = Acceptable stuck bit counts for BAI/beat Determine 4 worst bit array indexes for each beat, and pick random bit array index for any "worst" bit array index with zero stuck faults

| Pkg = 0 | Beat=0 | Beat=1 | Beat=2 | ... | Beat=13 | Beat=14 | Beat=15 |
|---|---|---|---|---|---|---|---|
| BAI=0 | ▨ | ▨ | ▨ | | ▨ | ☐ | ▨ |
| BAI=1 | ☒ | ▨ | ▨ | | ▨ | ▨ | ▨ |
| BAI=2 | ▨ | ▨ | ☒ | | ▨ | ☒ | ▨ |
| ... | | | | | | | |
| BAI=125 | ▨ | ▨ | ▨ | | ▨ | ▨ | ▨ |
| BAI=126 | ☒ | ▨ | ▨ | | ▨ | ▨ | ▨ |
| BAI=127 | ▨ | ▨ | ▨ | | ▨ | ▨ | ▨ |

No column (MRU) has more than 4 ☒ or ▨ bit array indexes, thus only bit array repair (BART update) needed

FIG. 9A

ERT Analysis indicates MRU replacement required

⊠ = Stuck bit counts exceed $T_H$ threshold for BAI/beat
◊ = Stuck bit counts exceed $T_L$ threshold for BAI/beat
▫ = Acceptable stuck bit counts for BAI/beat

| Pkg = 0 | Beat=0 | Beat=1 | Beat=2 | ... | Beat=13 | Beat=14 | Beat=15 |
|---|---|---|---|---|---|---|---|
| BAI=0 | ▫ | ▫ | ▫ | | ▫ | ⊠ | ▫ |
| BAI=1 | ⊠ | ◊ | ▫ | | ▫ | ◊ | ▫ |
| BAI=2 | ▫ | ▫ | ⊠ | | ▫ | ⊠ | ▫ |
| ... | | | | | | | |
| BAI=125 | ▫ | ▫ | ▫ | | ▫ | ⊠ | ▫ |
| BAI=126 | ▫ | ▫ | ▫ | | ▫ | ⊠ | ▫ |
| BAI=127 | ▫ | ▫ | ▫ | | ▫ | ⊠ | ▫ |

A column (MRU) has more than 4 ⊠ bit array indexes, or more than 11 ◊ / ⊠ bit array indexes, thus MRU replacement (MRT update) needed Note: If no spare MRU/IRU is available then VRU may need to be converted into spares and not returned to service.

FIG. 9B

ERT Analysis indicates IRU replacement required

▨ = Stuck bit counts exceed $T_H$ threshold for BAI/beat
▦ = Stuck bit counts exceed $T_L$ threshold for BAI/beat
▧ = Acceptable stuck bit counts for BAI/beat

| Pkg = 0 | Beat=0 | Beat=1 | Beat=2 | ... | Beat=13 | Beat=14 | Beat=15 |
|---|---|---|---|---|---|---|---|
| BAI=0 | ▨ | ▨ | ▨ | | ▨ | ▨ | ▦ |
| BAI=1 | ▨ | ▨ | ▨ | | ▦ | ▦ | ▨ |
| BAI=2 | ▦ | ▨ | ▨ | | ▨ | ▨ | ▨ |
| ... | | | | | | | |
| BAI=125 | ▨ | ▦ | ▨ | | ▨ | ▨ | ▨ |
| BAI=126 | ▨ | ▨ | ▨ | | ▨ | ▨ | ▨ |
| BAI=127 | ▨ | ▨ | ▧ | | ▨ | ▨ | ▨ |

All columns (MRUs) have more than 4 ▨ bit array indexes, or more than 11 ▨ / ▦ bit array indexes,
thus IRU replacement (CST update) needed
Note: If no spare IRU is available then VRU may need to be converted into spares and not returned to service.

FIG. 9C

LOGICAL TO VIRTUAL AND VIRTUAL TO PHYSICAL TRANSLATION IN STORAGE CLASS MEMORY

BACKGROUND

The disclosure herein relates generally to logical to virtual and virtual to physical memory translation for storage class memory (SCM).

Storage class memory (SCM) is a type of persistent memory that combines the low latency and byte-addressability of dynamic read access memory (DRAM) with the non-volatility, areal density, and economical characteristics of traditional storage media. Furthermore, given the byte-addressability and low latency of SCM technologies, central processing units (CPU) can access data stored in SCM without buffering the data in DRAM. Consequently, SCM technology blurs the distinction between computer memory and traditional storage media, and enable single level architectures without DRAM. Unlike traditional main memory and disk storage configurations, SCM provides a single level architecture.

Typically, SCM is implemented as groups of solid state devices connected to a computing system via several input/output (I/O) adapters, which are used to map technology of an I/O device to the memory bus of the central processing unit(s). However, writing data to SCM requires paying attention to specifics in the SCM technology: an SCM media card is organized as a collection of packages that each include "N" number of dies with millions of memory elements that are byte-addressable. One common characteristic of SCMs is that these memory devices have finite write endurance. A memory device with finite write endurance means that it cannot be written indefinitely before parts of the SCM start faulting. Identifying which memory is bad or error prone helps to decrease the risk of losing stored data. For example, memory bytes (or bit arrays) that are identified as bad may be avoided entirely while memory bytes that are not identified as bad may be used without restrictions. Furthermore, bad memory bytes in embodiments can be replaced with spare bytes.

SUMMARY

The summary of the disclosure is given to aid understanding of a computer system, computer architectural structure, processor, storage class memory (SCM), and method of media management, and not with an intent to limit the disclosure or the invention. The present disclosure is directed to a person of ordinary skill in the art. It should be understood that various aspects and features of the disclosure may advantageously be used separately in some instances, or in combination with other aspects and features of the disclosure in other instances. Accordingly, variations and modifications may be made to the computer system, the architectural structure, processor, SCM and their method of operation to achieve different effects.

A memory system for storing data in one or more storage chips is disclosed where the memory system in an embodiment includes: one or more memory cards, each card having a plurality of storage chips, and each chip having a plurality of dies having a plurality of memory cells; a memory controller comprising a translation module, the translation module further includes: a logical to virtual translation table (LVT) having a plurality of entries, each entry in the LVT configured to map a logical address to a virtual block address (VBA), where the VBA corresponds to a group of the memory cells, e.g., a logical block address (LBA), on the one or more memory cards, wherein each entry in the LVT further includes a write wear level count to track the number of writing operations to the VBA mapped to that LVT entry, and a read wear level count to track the number of read operations for the VBA mapped to that LVT entry. In one or more embodiments, the write wear level count in the LVT is programmable to have a write level threshold corresponding to the maximum number of writing operations to a VBA, and in response to a write operation exceeding (or equal to) the write level threshold in an LVT entry, the data in the memory card corresponding to the LVT entry that exceeds (or is equal to) the write level threshold is moved to a new location on the memory card with a different VBA.

The memory system in an embodiment includes a VBA Free List identifying the VBAs available to write data to, and in response to a write operation, a new VBA is obtained from the VBA Free List. The system in one or more embodiments is configured to obtain a new VBA from the VBA Free List based upon the wear level count. In an aspect, the read wear level count in the LVT is programmable to have a read level threshold corresponding to a maximum number of reading operations of a VBA, and in response to a read operation exceeding the read level threshold in a LVT entry, the data in the memory card corresponding to the LVT entry that exceeds (or is equal to) the read level threshold is written to a new location on the memory card with a different VBA. The system, in response to a read operation exceeding (or equal to) the read level threshold for a LVT entry, is configured to obtain a new VBA from the VBA Free List, and the data in the memory card corresponding to the LVT entry that exceeds (or is equal to) the read level threshold is written to the new location on the memory card with the different VBA.

The memory system in one or more embodiments includes a Drift Buffer having a plurality of entries to temporarily store data, and a Drift Table having a plurality of entries, each Drift Table entry configured to index to one of the plurality of entries in the Drift Buffer, each entry of the Drift Table mapping a Drift Buffer Index to a VBA, wherein the system is configured, in response to writing data to the memory card, to also write the data to an entry in the Drift Buffer and further to write the VBA and the corresponding logical address, e.g., logical block address (LBA), into an entry in the Drift Table indexed to the corresponding entry in the Drift Buffer. The memory system in an embodiment is configured to read from the Drift Buffer if data corresponding to the VBA is present in the Drift Buffer. The Drift Buffer in an aspect is a circular FIFO buffer contained on the memory card. Each LVT entry includes a field to indicate whether the Drift Buffer contains the data corresponding to that LVT entry, wherein the system is configured in response to a hit on an LVT entry where the LVT field indicates data is in the Drift buffer, the LVT entry points to an entry in the Drift Table. Each LVT entry in an embodiment has a drift buffer index valid field to indicate whether the Drift Buffer contains data corresponding to each respective LVT entry, and wherein the system is configured so that in response to a request to read data from the memory card, the system is configured to look-up the logical address in the LVT and in response to finding a LVT entry that corresponds to the logical address, the system checks the drift buffer index valid field, and in response to the drift buffer index valid field indicating the requested data is not in the Drift Buffer, the system utilizes the VBA from that LVT entry, and in response to the drift buffer index valid field indicating the requested data is in the Drift Buffer, the system reads the requested data from the Drift Buffer. The system is configured in an aspect so that in response to the drift buffer valid field indicating that the requested data is in the Drift Buffer, the LVT points to an entry in the Drift Table, and the system utilizes the information in the Drift Table to obtain the requested data from a corresponding entry in the Drift Buffer. The system, according to an embodiment, is configured so that in response to data being removed from a Drift Buffer entry, the LVT entry corresponding to the Drift Buffer entry from which data is removed is updated so that the LVT entry contains the VBA of the entry removed from the Drift Buffer.

A method according to one or more embodiments for reading data from one or more memory cards where each memory card has a plurality of storage chips and each storage chip has a plurality of dies having a plurality of memory cells is disclosed. The method in an aspect includes: issuing a request for data located on the one or more memory cards; looking up a logical address for the requested data in a logical to virtual translation table (LVT) having a plurality of entries, each entry in the LVT mapping a logical address to a virtual block address (VBA), where the VBA corresponds to a group of memory cells in the one or more memory cards; in response to locating the logical address, e.g., logical block address (LBA), of the requested data in an entry in the LVT, checking that LVT entry to determine whether the data is located in a Drift Buffer; in response to determining the data is located within the Drift Buffer, reading the requested data from the Drift Buffer; and in response to determining the data is not located in the Drift Buffer, obtaining the VBA from the LVT entry corresponding to the logical address, e.g., logical block address (LBA), of the requested data and read the requested data in the memory card corresponding to the VBA.

The method in an embodiment further includes, in response to reading the requested data from the memory card, updating a read level count field in the LVT. The method according to an aspect further includes comparing the read level count in the LVT entry to a read level threshold field in the LVT entry, and in response to the read level count being equal to or exceeding the read level threshold, write the data to be read to a new location on the one or more memory cards with a different VBA. In response to writing the data to be read to a new location on the one or more memory cards with a different VBA, the method includes in an embodiment updating the LVT with the different VBA. The method further includes in an aspect updating the VBA in a corresponding LVT entry in response to data being removed from the Drift Buffer. The method according to another aspect includes moving an entry to the head of the Drift Buffer in response to reading data from the Drift Buffer.

A further method of writing data to one or more memory cards is disclosed where each memory card has a plurality of storage chips, and each storage chip has a plurality of dies having a plurality of memory cells. The method in one or more embodiments includes: issuing a request to write the data to the one or more memory cards; obtaining an available VBA from a VBA Free List; write the data to the memory card location corresponding to the available VBA obtained from the VBA Free List; write the data to an entry in a Drift Buffer; and write the VBA of the available VBA and the corresponding logical address to that available VBA to an entry in a Drift Table that corresponds to the entry in the Drift Buffer. The method in an aspect further includes writing the corresponding LVT entry with the available VBA. In an embodiment, the method further includes: writing into the LVT entry corresponding to the VBA that corresponds to the location on the memory card to which the data is written, a drift table index identifying the drift table entry corresponding to the Drift Buffer entry to which the data is written, and setting a bit to identify the data is in the Drift Buffer.

The foregoing and other objects, features and advantages of the invention will be apparent from the following more particular descriptions of exemplary embodiments of the invention as illustrated in the accompanying drawings wherein like reference numbers generally represent like parts of illustrative embodiments of the invention.

BRIEF DESCRIPTION OF THE DRAWINGS

The various aspects, features and embodiments of a computer system, computer architectural structure, processor, memory system, and their method of operation will be better understood when read in conjunction with the figures provided. Embodiments are provided in the figures for the purpose of illustrating aspects, features, and/or various embodiments of the computer system, computer architectural structure, processors, SCM, and their method of operation, but the claims should not be limited to the precise arrangement, structures, features, aspects, assemblies, subassemblies, systems, circuitry, embodiments, methods, processes, techniques, and/or devices shown, and the arrangements, structures, systems, assemblies, subassemblies, features, aspects, methods, processes, techniques, circuitry, embodiments, and devices shown may be used singularly or in combination with other arrangements, structures, assemblies, subassemblies, systems, features, aspects, circuitry, embodiments, methods, techniques, processes, and/or devices.

FIG. 7 is a flowchart illustrating an example method for a scrub process of the memory system of FIGS. 2A and 2B.

FIGS. 9A, 9B and 9C illustrate example scenarios for different types of memory repair actions of the memory system of FIGS. 2A and 2B.

DETAILED DESCRIPTION

The following description is made for illustrating the general principles of the invention and is not meant to limit the inventive concepts claimed herein. In the following detailed description, numerous details are set forth in order to provide an understanding of the computer system, computer architectural structure, processor, caches, memory systems and their method of operation, however, it will be understood by those skilled in the art that different and numerous embodiments of the computer system, computer architectural structure, processor, caches, memory systems and their method of operation may be practiced without those specific details, and the claims and disclosure should not be limited to the arrangements, structures, systems, assemblies, subassemblies, circuitry, features, aspects, processes, methods, techniques, embodiments, and/or details specifically described and shown herein. Further, particular features, aspects, arrangements, systems, embodiments, techniques, etc. described herein can be used in combination with other described features, aspects, arrangements, systems, embodiments, techniques, etc. in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc. It must also be noted that, as used in the specification and the appended claims, the singular forms "a," "an" and "the" include plural referents unless otherwise specified, and that the terms "comprises" and/or "comprising," when used in this specification and claims, specify the presence of stated features, integers, aspects, arrangements, embodiments, structures, systems, assemblies, subassemblies, steps, operations, elements, and/or components, but do not preclude the presence or addition of one or more other features, integers, aspects, arrangements, embodiments, structures, systems, assemblies, subassemblies, steps, operations, elements, components, and/or groups thereof.

The following discussion omits or only briefly describes conventional features of information processing systems, including processors and microprocessor systems and architectures, as well as address translation techniques and systems, which should be apparent to those skilled in the art. It is assumed that those skilled in the art are familiar with the general architecture of processors, and in particular with address translation techniques and systems, and their operation. It may be noted that a numbered element is numbered according to the figure in which the element is introduced, and is typically referred to by that number throughout succeeding figures.

Figure 1:
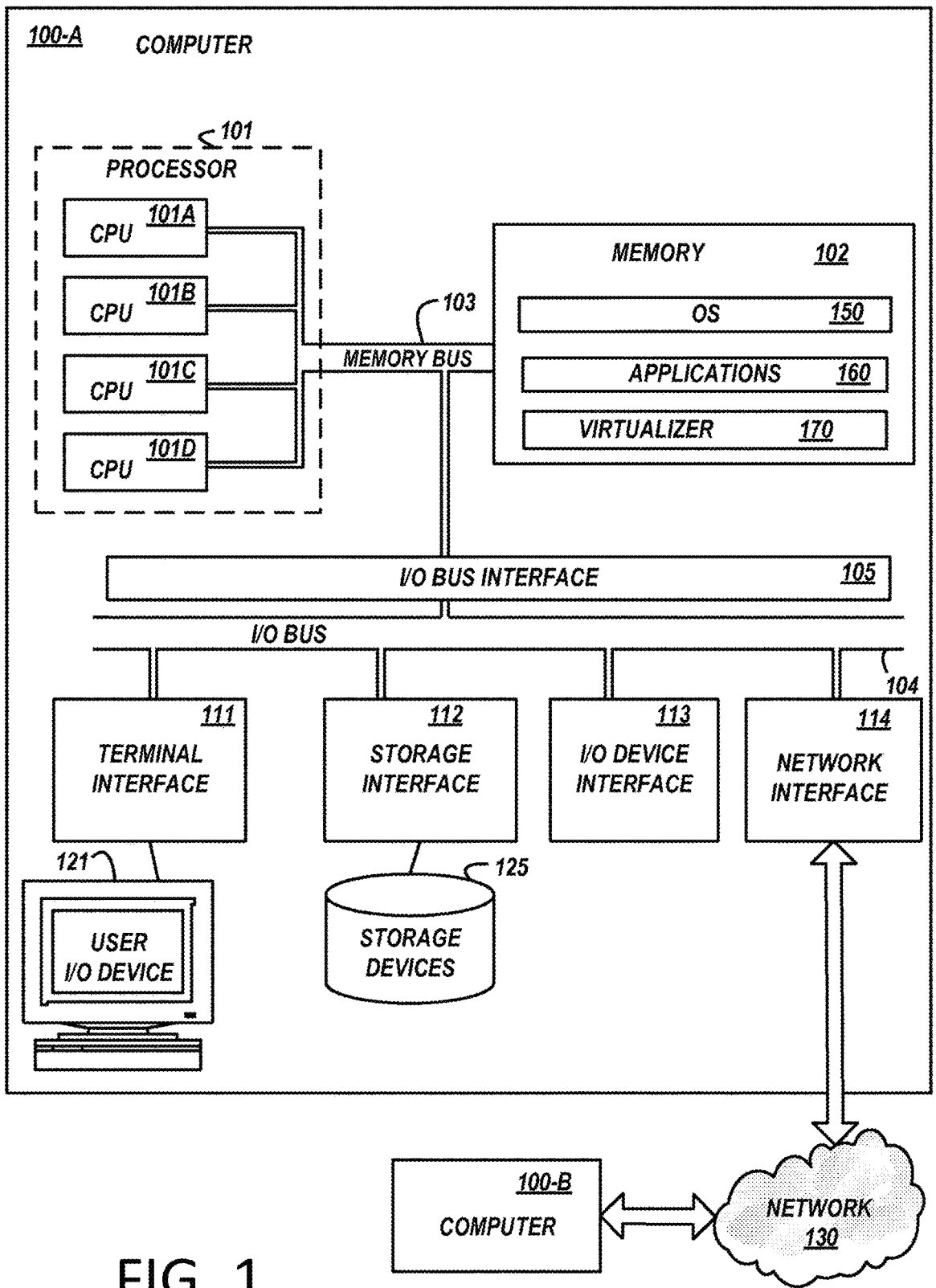
FIG. 1 is a functional block diagram illustrating a computer system, according to embodiments of the present disclosure.

FIG. 1 depicts a high-level block diagram representation of a computer 100-A connected to another computer 100-B via a network 130, according to an embodiment of the present invention. The term "computer" is used herein for convenience only, and in various embodiments is a more general data handling system, such as a mobile phone, tablet, server computer, etc. The mechanisms and apparatus of embodiments of the present invention apply equally to any appropriate data handling system.

The major components of the computer 100 may comprise one or more processors 101, a main memory system 102, a terminal interface 111, a storage interface 112, an I/O (Input/Output) device interface 113, and a network adapter or interface 114, all of which are communicatively coupled, directly or indirectly, for inter-component communication via a memory bus 103, an I/O bus 104, and an I/O bus interface unit 105. The computer 100 contains one or more general-purpose programmable central processing units (CPUs) 101A, 101B, 101C, and 101D, herein generically referred to as the processor 101. In an embodiment, the computer 100 contains multiple processors typical of a relatively large system; however, in another embodiment the computer 100 may alternatively be a single CPU system. Each processor 101 executes instructions stored in the main memory system 102 and may comprise one or more levels of on-board cache.

In an embodiment, the main memory system 102 may comprise a random-access semiconductor memory (e.g., a DRAM, an SCM, or both), storage device, or storage medium for storing or encoding data and programs. In another embodiment, the main memory system 102 represents the entire virtual memory of the computer 100, and may also include the virtual memory of other computer systems coupled to the computer 100 or connected via the network 130. The main memory system 102 is conceptually a single monolithic entity, but in other embodiments the main memory system 102 is a more complex arrangement, such as a hierarchy of caches and other memory devices. For example, memory may exist in multiple levels of caches, and these caches may be further divided by function, so that one cache holds instructions while another holds non-instruction data, which is used by the processor or processors. Memory may be further distributed and associated with different CPUs or sets of CPUs, as is known in any of various so-called non-uniform memory access (NUMA) computer architectures.

The main memory system 102 stores or encodes an operating system (OS) 150, an application 160, and/or other program instructions. Although the operating system (OS) 150, application 160, etc. are illustrated as being contained within the main memory system 102 in the computer 100, in other embodiments some or all of them may be on different computer systems and may be accessed remotely, e.g., via the network 130. The computer 100 may use virtual addressing mechanisms that allow the programs of the computer 100 to behave as if they only have access to a large, single storage entity instead of access to multiple, smaller storage entities. Thus, while operating system 150, application 160, or other program instructions are illustrated as being contained within the main memory system 102, these elements are not necessarily all completely contained in the same storage device at the same time. Further, although operating system 150, application 160, other program instructions, etc. are illustrated as being separate entities, in other embodiments some of them, portions of some of them, or all of them may be packaged together.

In an embodiment, operating system 150, application 160, and/or other program instructions comprise instructions or statements that execute on the processor 101 or instructions or statements that are interpreted by instructions or statements that execute on the processor 101, to carry out the functions as further described below. When such program instructions are able to be run by the processor 101, such computer 100 becomes a particular machine configured to carry out such instructions. For example, instructions for a memory mirroring application 160A may be loaded upon one or more computers 100A that causes the computer 100A to mirror the main memory system 102 into a first portion and into a redundant second portion. In another example, main memory system 102 may be mirrored by operating system 150. In another example, main memory system 102 may be mirrored by a virtualizer application 170, such as a hypervisor.

One or more processors 101 may function as a general-purpose programmable graphics processor unit (GPU) that builds images (e.g. a GUI) for output to a display. The GPU, working in conjunction with one or more applications 160, determines how to manipulate pixels on, for example, a display, touch screen, etc. to create a display image or user interface. Ultimately, the image (e.g. GUI, etc.) is displayed to a user. The processor 101 and GPU may be discrete components or may be integrated into a single component.

The memory bus 103 provides a data communication path for transferring data among the processor 101, the main memory system 102, and the I/O bus interface unit 105. The I/O bus interface unit 105 is further coupled to the system I/O bus 104 for transferring data to and from the various I/O units. The I/O bus interface unit 105 communicates with multiple I/O interface units 111, 112, 113, and 114, which are also known as I/O processors (IOPs) or I/O adapters (IOAs), through the system I/O bus 104. The I/O interface units support communication with a variety of storage and I/O devices. For example, the terminal interface unit 111 supports the attachment of one or more user I/O devices 121, which may comprise user output devices (such as a video display device, speaker, and/or television set) and user input devices (such as a keyboard, mouse, keypad, touchpad, trackball, buttons, light pen, or other pointing device). A user may manipulate the user input devices using a user interface, in order to provide input data and commands to the user I/O device 121 and the computer 100, and may receive output data via the user output devices. For example, a user interface may be presented via the user I/O device 121, such as displayed on a display device, played via a speaker, or printed via a printer. The user interface may be a user interface that provides content to a user visually (e.g. via a screen), audibly (e.g. via a speaker), and/or via touch (e.g. vibrations, etc.). In some embodiments, the computer 100 itself acts as the user interface as the user may move the computer 100 in ways to interact with, input, or manipulate computer application 160 data, function, etc.

The storage interface unit 112 supports the attachment of one or more local disk drives or secondary storage devices 125. In an embodiment, the secondary storage devices 125 are rotating magnetic disk drive storage devices, but in other embodiments they are arrays of disk drives configured to appear as a single large storage device to a host computer, or any other type of storage device. The contents of the main memory system 102, or any portion thereof, may be stored to and retrieved from the secondary storage devices 125, as needed. The local secondary storage devices 125 typically have a slower access time than does the main memory system 102, meaning that the time needed to read and/or write data from/to the main memory system 102 is less than the time needed to read and/or write data from/to for the local secondary storage devices 125.

The I/O device interface 113 provides an interface to any of various other input/output devices or devices of other types, such as printers or fax machines. The network adapter 114 provides one or more communications paths from the computer 100 to other data handling devices such as numerous other computers; such paths may comprise, e.g., one or more networks 130. Although the memory bus 103 is shown in FIG. 2 as a relatively simple, single bus structure providing a direct communication path among the processors 101, the main memory system 102, and the I/O bus interface 105, in fact the memory bus 103 may comprise multiple different buses or communication paths, which may be arranged in any of various forms, such as point-to-point links in hierarchical, star or web configurations, multiple hierarchical buses, parallel and redundant paths, or any other appropriate type of configuration. Furthermore, while the I/O bus interface 105 and the I/O bus 104 are shown as single respective units, the computer 100 may, in fact, contain multiple I/O bus interface units 105 and/or multiple I/O buses 104. While multiple I/O interface units are shown, which separate the system I/O bus 104 from various communications paths running to the various I/O devices, in other embodiments some or all of the I/O devices are connected directly to one or more system I/O buses.

I/O interface 113 may contain electronic components and logic to adapt or convert data of one protocol on I/O bus 104 to another protocol on another bus. Therefore, I/O interface 113 may connect a wide variety of devices to computer 100 and to each other such as, but not limited to, tape drives, optical drives, printers, disk controllers, other bus adapters, PCI adapters, workstations using one or more protocols including, but not limited to, Token Ring, Gigabyte Ethernet, Ethernet, Fibre Channel, SSA, Fiber Channel Arbitrated Loop (FCAL), Serial SCSI, Ultra3 SCSI, Infiniband, FDDI, ATM, 1394, ESCON, wireless relays, Twinax, LAN connections, WAN connections, high performance graphics, etc. Though shown as distinct entities, the multiple I/O interface units 111, 112, 113, and 114 or the functionality of the I/O interface units 111, 112, 113, and 114 may be integrated into a similar device.

In various embodiments, the computer 100 is a multi-user mainframe computer system, a single-user system, a server computer, storage system, or similar device that has little or no direct user interface, but receives requests from other computer systems (clients). In other embodiments, the computer 100 is implemented as a desktop computer, portable computer, laptop or notebook computer, tablet computer, pocket computer, telephone, smart phone, pager, automobile, teleconferencing system, appliance, or any other appropriate type of electronic device.

The network 130 may be any suitable network or combination of networks and may support any appropriate protocol suitable for communication of data and/or code to/from the computer 100A and at least the computer 100B. In various embodiments, the network 130 may represent a data handling device or a combination of data handling devices, either connected directly or indirectly to the computer 100. In another embodiment, the network 130 may support wireless communications. Alternatively and/or additionally, the network 130 may support hard-wired communications, such as a telephone line or cable. In an embodiment, the network 130 may be the Internet and may support IP (Internet Protocol). In an embodiment, the network 130 is implemented as a local area network (LAN) or a wide area network (WAN). In an embodiment, the network 130 is implemented as a hotspot service provider network. In another embodiment, the network 130 is implemented on an intranet. In an embodiment, the network 130 is implemented as any appropriate cellular data network, cell-based radio network technology, or wireless network. In an embodiment, the network 130 is implemented as any suitable network or combination of networks. Although one network 130 is shown, in other embodiments any number of networks (of the same or different types) may be present.

FIG. 1 is intended to depict the representative major components of the computer 100. But, individual components may have greater complexity than represented in FIG. 1, components other than or in addition to those shown in FIG. 1 may be present, and the number, type, and configuration of such components may vary. Several particular examples of such additional complexity or additional variations are disclosed herein; these are by way of example only and are not necessarily the only such variations. The various program instructions implementing, for example, upon computer system 100 according to various embodiments of the invention may be implemented in a number of manners, including using various computer applications, routines, components, programs, objects, modules, data structures, etc.

Figure 2A:
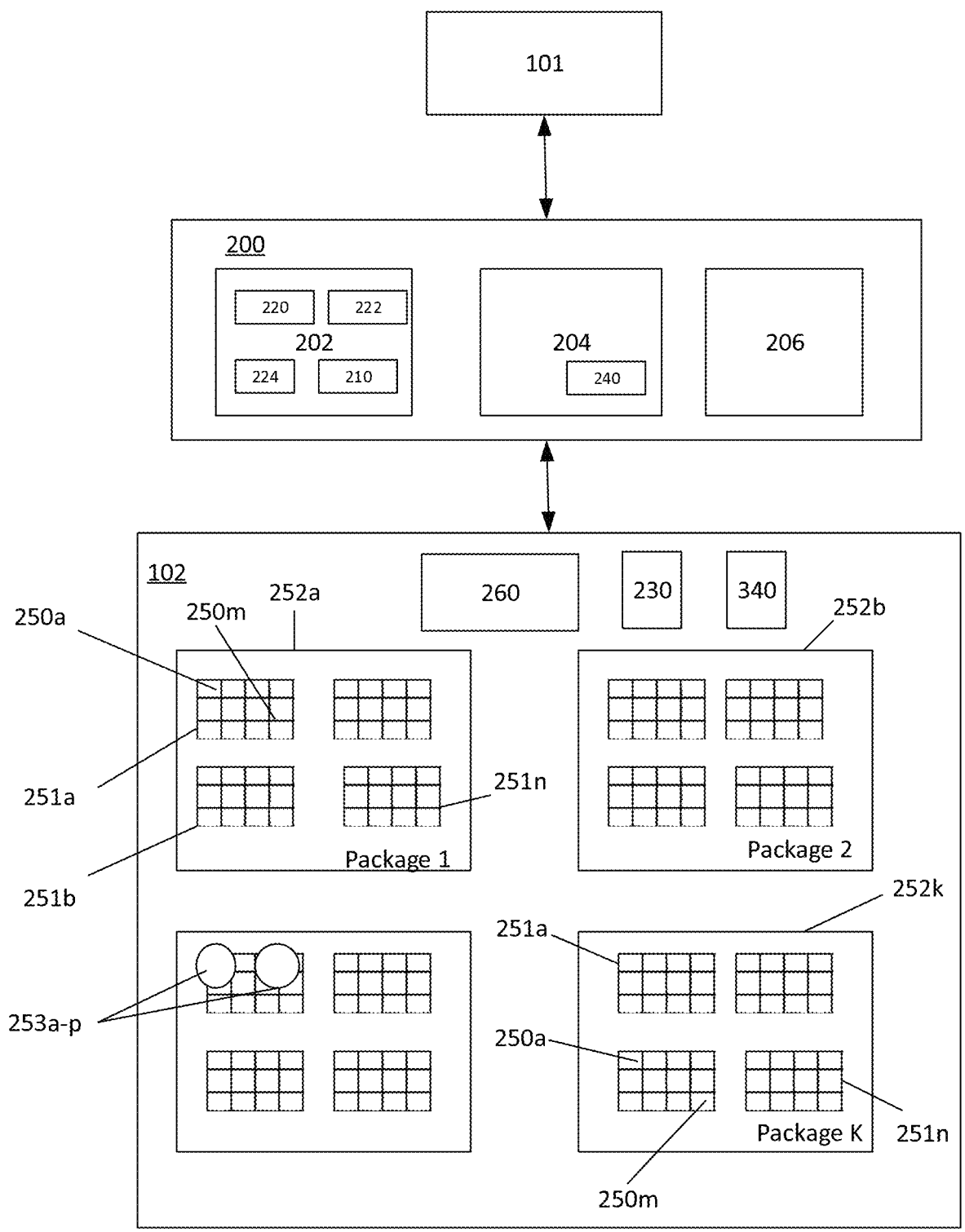
FIG. 2A is a functional block diagram illustrating an example memory system and controller, according to embodiments of the present disclosure.

Referring now to FIG. 2A, a schematic block diagram of an example main memory system 102 in communication with the processor 101 via a memory controller 200 is illustrated. As shown in FIG. 2A, memory module(s) or card(s) 102 (e.g., an SCM media card) is configured to store data in a plurality "K" of packages, (i.e., chips) 252a-k (e.g., K=24), and each package includes a plurality "N" dies 251a-n (e.g., N=16). Each package in an embodiment can include the same number "N" of dies (e.g., N=8, 16, etc.). Each of dies 251a-n includes a number "M" of memory cells, in particular memory cells 250a-m. A number of the memory cells 250 in each die may be grouped into a number "X" of media replacement unit (MRU) groups 253a-p, each die in an embodiment can include a fixed number of MRUs groups 253. For example, there could be 16 (X=16) MRU groups in a die 251. Memory module/card 102 in one or more embodiments also includes a Drift Buffer 260 for storing data, for example temporarily storing data as will be described later. Memory module/card 102 in an aspect also includes a Drift Table 230 for mapping entries to the Drift Buffer 260 as will be described later.

Figures 2B, 6A:
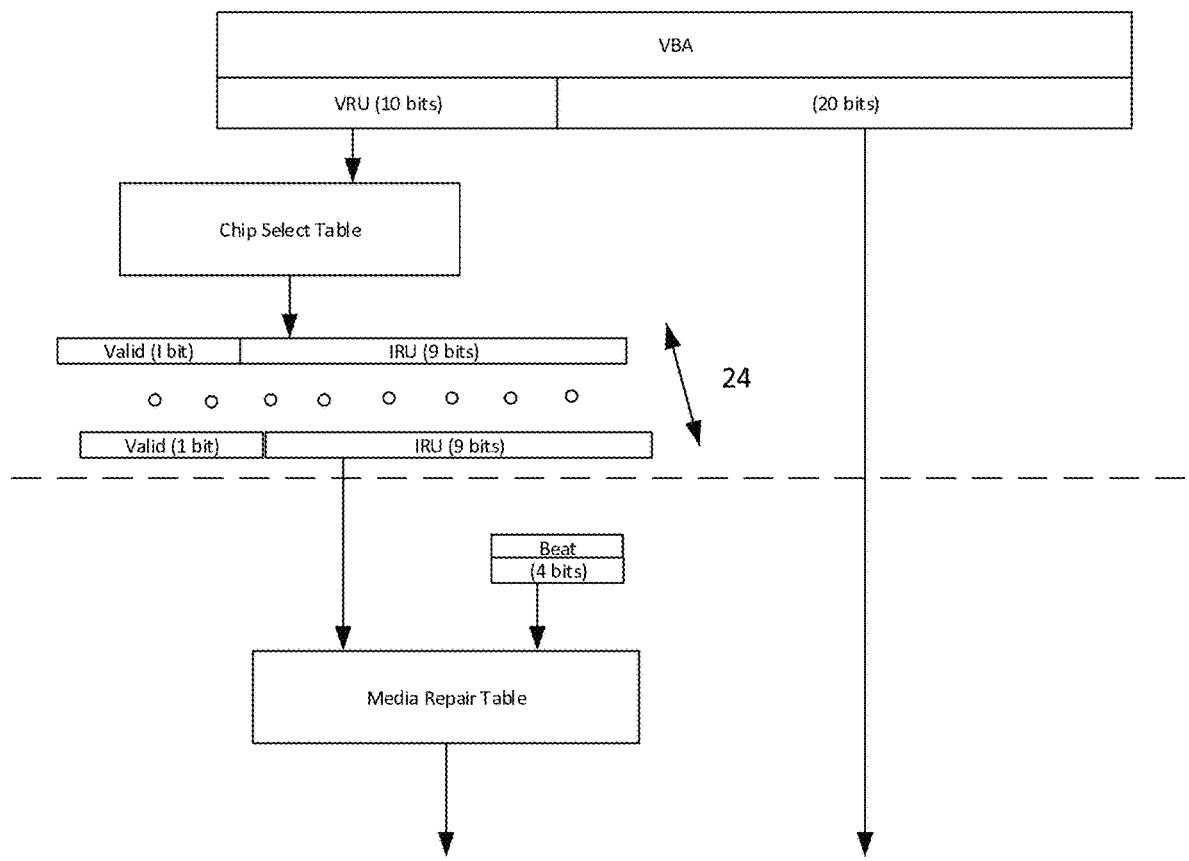
FIG. 2B depicts an example structure of the memory system of FIG. 2A.
FIG. 6A is a block diagram of an over view of an embodiment of a method and hardware for translating a virtual address to a physical address in a memory system, for example the memory system of FIGS. 2A and 2B.

Further, as shown in FIG. 2B, each MRU group 253a-p may comprise a plurality of MRUs 254a-n, each MRU comprising a plurality "B" of bit arrays, and each bit in a bit array comprising a memory cell. That is, as shown in FIG. 2B, a MRU group in an embodiment is split into 128 columns referred to as a bit array. The MRU group is split horizontally into rows called MRUs. Each MRU has 128 bit arrays. Each box in FIG. 2B can be a bit array of 1 million bits. Furthermore, each MRU includes "P" number of pages, where a page is the unit of data that can be written or read in the SCM (e.g., 16 bytes or 128 bits). In an embodiment, an MRU can contain 1M pages. A page uses a bit from the active bit arrays during a read-write operation. The number of active bit arrays from which each page takes a memory cell may depend upon the required redundancy of memory cells in the memory module/card 102 and/or the scrub process (as described below). For example, in each MRU, if four bit arrays are reserved as spares for swapping operations with failing/error-prone bit arrays, each page will include bits from the 124 active bit arrays of the 128 bit arrays during a read-write operation (128 bit arrays in MRU minus the 4 reserved bit arrays=124 active bit arrays). This means that a page can store 15.5 bytes of actual data. As described below, spare MRUs from all the MRU groups and dies in a single package may replace failing MRUs in that package.

It should be noted that using 1 million bits (1024*1024) per bit array is a design choice for the example embodiments disclosed in this disclosure. However, the disclosure is not so limiting and any number of bits per bit array (e.g., 500,000, 2 million, 3 million, etc.) may be used. The number of bits per bit array is then used to determine the number of MRUs, and thus the size of the tables (e.g., the Chip Select Table (CST), the Media Repair Table (MRT), the Bit Array Repair Table (BART), etc.)

The total capacity of the memory module/card 102 can be determined according to K*C (measured in bytes), where C is the capacity of each package. Out of the K packages of the memory module/card 102, some packages may be used to store the data, and the other or remaining packages may be used for error-correcting code (ECC) and metadata used for data management. The error correction code is used for correcting an error included in the data stored in the data area. Each memory module/card 102 (e.g., SCM media card) has I/O data with z-bit data width, and appropriate-sized address bits depending on the capacity. SCM may be, for example, Phase Change Memory (PCM), Resistive RAM (RRAM) or any suitable non-volatile storage.

While FIG. 2A illustrates the memory controller 200 as being located outside the memory module/card 102, the disclosure is not so limiting, and the controller 200 may be a part of the memory module/card 102. As illustrated in FIG. 2A, controller 200 may include at least one of an address translation module 202, a scrub module 204, and a media repair module 206. Modules 202, 204, and 206 may be implemented in software, firmware, hardware, or a combination of two or more of software, firmware, and hardware. In other examples, controller 200 may include additional modules or hardware units, or may include fewer modules or hardware units. Controller 200 may include a microprocessor, digital signal processor (DSP), application specific integrated circuit (ASIC), field programmable gate array (FPGA), or other digital logic circuitry.

The address translation module 202 may associate a logical block address (LBA) and/or a virtual block address (VBA) used by processor(s) 101 with a physical block address (PBA) of memory module/card 102 (as discussed below). For example, in response to address translation module 202 receiving an LBA from a processor as part of a read or write command, address translation module 202 may look-up the VBA via a Logical-to-Virtual Table (LVT) 210, address translation module 202 may then use the VBA to determine a PBA of memory module/card 102 that corresponds with the received LBA. In some examples, address translation module 202 may use a tiered virtual-to-physical table structure (V2P) for performing the translation from the VBA to the PBA (as described below). For example, the address translation module 202 may include a chip select table (CST) 220, a media repair table (MRT) 222, and a bit array repair table (BART) 224.

The scrub module 204 may be configured for detecting and correcting failures or errors in the memory module/card 102. An error in memory may be caused by an alpha or other particle, or by a physical defect in a memory cell. As used herein, the term "scrubbing" generally refers to a process of detecting errors and correcting correctable errors in a memory system. The errors can include soft (or transient) errors as well as, in certain circumstances, hard errors. In various embodiments, memory scrubbing may use a process of detecting and correcting bit errors in memory as described below. In order to not disturb regular memory requests from the CPU and thus prevent decreasing performance, scrubbing may be done by taking particular parts of memory module/card 102 out of service for the scrub process (described below). As the scrubbing may consist of normal read and/or write operations, it may increase power consumption by the memory compared to a non-scrubbing operation. Therefore, scrubbing is not performed continuously but periodically, according to various embodiments. For many servers, the timing or period for the scrub may be configured in the BIOS setup program.

In certain embodiments, the scrub module 204 may include an error rate table (ERT) 240. The error rate table may be configured to store information relating to memory defects or errors in the memory module/card 102. In certain embodiments, an ERT may be assigned for each of the packages included in the memory module/card 102 (e.g., 24 ERTs for 24 packages of a media card).

The media repair module 206 may be configured for repairing errors or defects in the memory module/card 102 by analyzing the information stored in the ERT(s). For example, the media repair module 206 may create ERT summary tables, and cause the memory controller to perform appropriate corrective actions such as, without limitation, replacement of one or more failing parts of the memory module/card 102 with a properly functioning spare (e.g., replace faulty bit arrays, MRUs, MRU groups, dies, or packages with an appropriate spare); modification of the various translation tables; search for spare memory parts/locations; creation of spare memory parts/locations; rebalancing of spare memory parts/locations (to increase the likelihood of locating spares for future replacements). The media repair module 206 in an embodiment can be configured to account for functional correctness while avoiding replacements which could negatively affect performance of the memory module/card 102.

Figure 3:
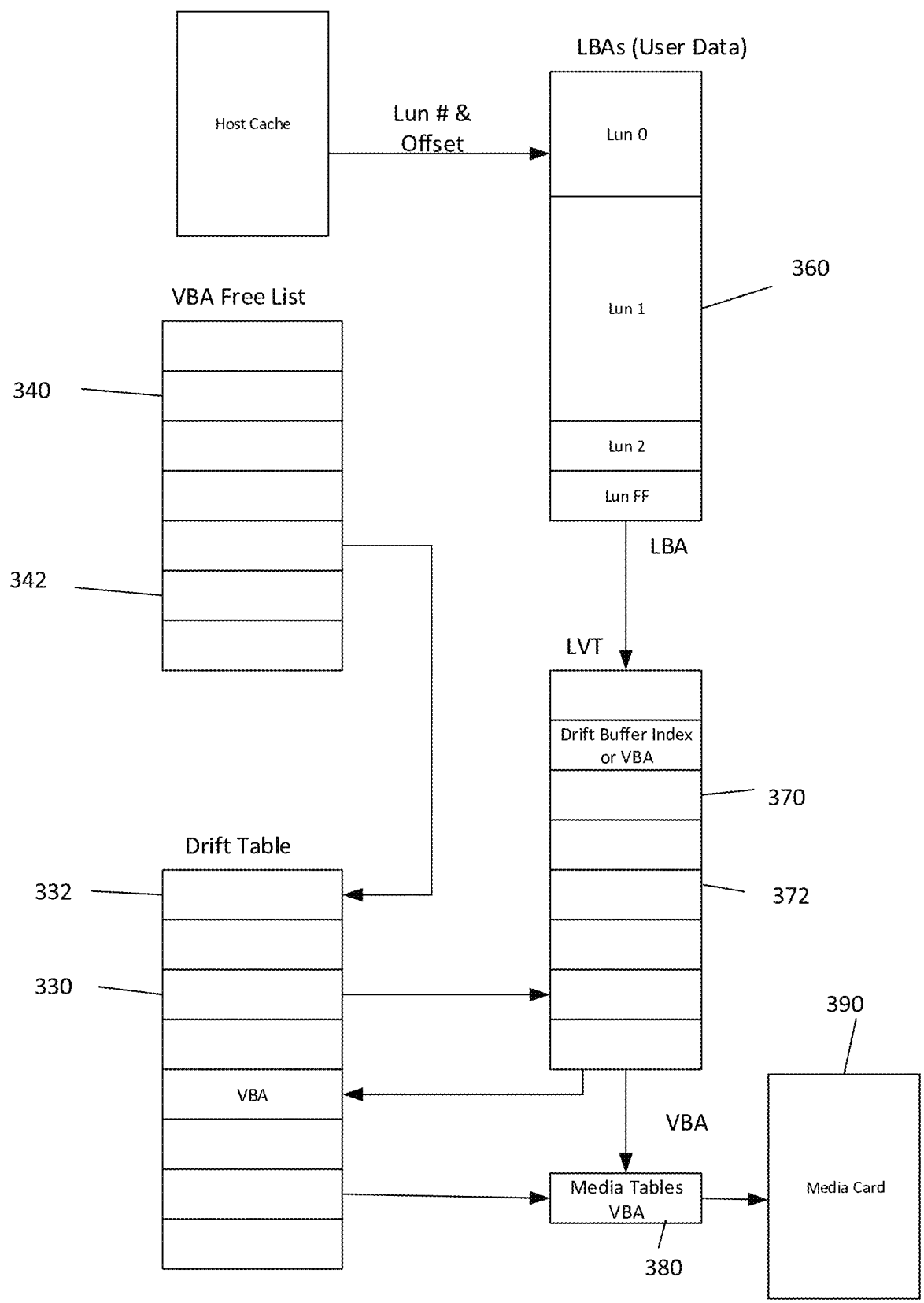
FIG. 3 illustrates a block diagram of an embodiment of the hardware and process of translating a logical address to a physical address in a memory system.

Referring now to FIG. 3, a block diagram overview of an embodiment of the hardware in a memory system and process flow for translating a logical address to a virtual address (logical to virtual (L2V) translation), where the virtual address can be translated into a real or physical address (virtual to physical (V2P) translation) on the media card 390. The Host addresses the memory/media card 390 via a Logical Unit Number (LUN) and a logical unit number offset (LUN offset). A conversion table 360 translates these LUNs and LUN offsets into a Logical Block Address (LBA). Multiple LUNs are supported as shown in LBA Table 360 in FIG. 3. In an embodiment, there is a LBA for each 4 KB block the Host can access. The LBA is fed into a Logical to Virtual Translation Table (LVT) 370 that converts or translates each LBA into a virtual entry or address, for example, a Virtual Block Address or VBA. The VBA is fed into media tables 380 where the virtual address, e.g., VBA, is translated into a physical or real address on media card 390 as explained in detail in later portions of the disclosure. The virtual to physical translation in one or more embodiments includes Chip Select Tables (CST), Media Repair Tables (MRT), and Bit Array Repair Tables (BART) to repair the media.

The LVT 370 in one or more embodiments is arranged as a table structure and has multiple entries 372. In an embodiment, each entry 372 in the LVT 370 includes the Virtual Block Address (VBA) or Drift Table Index, write wear level count data, and read wear level count data. For each LBA there is a one-to-one mapping to a VBA (assuming the LBA is not trimmed). Other metadata can be included in the LVT. The LVT 370 in an embodiment is stored in DRAM, and in an aspect the field size of each entry is small, for example, 8-bytes per entry. The LVT 370 in an embodiment is located in the memory controller 200, and in an aspect can be included in the address translation module 202 shown in FIG. 2A (LVT 210 in FIG. 2A). Table 1 below illustrates an example of a LVT entry 372.

TABLE 1

LVT Entry Fields

| Byte Offset | Bits | Description |
| --- | --- | --- |
| 0x00 | 63:56 | Reserved |
|  | 55 | Parity over entry |
|  | 54 | Trimmed Indicator bit |
|  | 53:40 | Read count (14 bits). Records the number of Media reads issued for this LBA. Hardware sets this value to zero when LBA is written (due to host write or wear level copy or vremove active). Hardware increments the read count for every read that goes to the media, not the drift buffer. Once this count exceeds a threshold, e.g., 10,000 reads, then hardware will do a "wear level" (W/L) copy of this data. |
|  | 39:32 | Wear level count (8 bits). In an embodiment, valid range is 0x00 to 0x7F. The wear level entry in an aspect is invalid when bits 39:32 = 0xFF. The wear level count (bits 39:32) and the LVT entry (bits 29:0) in an embodiment are both valid or both invalid. |
|  | 31 | Drift Buffer Index (DBI) Valid bit |
|  | 30 | Media Select bit: 0 selects Media Card 0, 1 selects Media Card 1 |
|  | 29:0 | When bit 31 is set to 0, then bits 29:0 is a VBA selecting a 5120B block on the PCMs. In an embodiment, this LVT entry is invalid, or trimmed, when bits 29:0 = 0x3FFF_FFFF. When bit 31is set to 1, bits 29:21 = 0, and bits 20:0 are an Index into the Drift Table and an 8GB Drift Buffer. |

The LVT entry in Table 1 is just one example, and other storage media, fields, and field sizes are contemplated for the LVT 370 and the LVT entries 372. The media on the media card 390 will wear out some locations over time, so in one or more embodiments the design will overprovision. There should be a small amount of over-provisioning to account for the media wearing out, and thus according to one aspect, the number of LBAs typically will be slightly less than the number of VBAs, for example 10% less. So, for example, if the media card 390 supports 614M VBAs, then the LVT 370 will have close to 614M entries. In an embodiment, the Host is instructed that the total size of memory is smaller than its actual size.

The media card 390 permits a write operation to be performed to the same address/location, but since writes can disturb adjacent areas on the media card 390, in an embodiment, new data is written to a different location on the media card 390. In an aspect, no location on the media card 390 is written to more than a threshold number, e.g., 10,000 times, more than any other location on the media card 390. For example, a location on the media card 390, e.g., a block of memory cells, in an embodiment is not written "Y" times the number of times another location on the media card is written. The write wear level field in the LVT 370 (bits 39:32 in Table 1) is used to control this aspect of the operation. Reads also can disturb the media, so data should be rewritten to a new location/address after "N" reads of a location. The LVT 370 has a read wear level count (bits 53:40 in Table 1) to track and record the number of reads that have occurred to that block since the last time it was written. In response to the read count exceeding a value, e.g., a threshold value, that block will be moved and/or copied to a new location on the media card, which will have a new VBA. For example, after 10,000 reads the hardware will do a wear level move where the data is copied/written to a new location on the media card which has a corresponding new VBA.

After a new location on the media card is written it should not be read for a period of time, generally milliseconds, for example, 10 milliseconds. To overcome the potential latency of waiting to read the new location on the media card, a Drift Buffer in an embodiment is provided. Drift Buffer 260 in an embodiment is included on the media card 102 shown in FIG. 2A. The Drift Buffer preferably is a FIFO buffer that is used to hold a copy of the newly written data, so that the Drift Buffer can be read instead of the media card 390 during the time frame that the newly written media should not be read. The Drift Buffer has multiple entries, and in an embodiment has a table or index, e.g., a Drift Buffer Index or Drift Table 330, to correlate the VBA and the entry in the Drift Buffer. When data is freshly written to the media, e.g., the memory card, the data is also written to a Drift Buffer entry, and the VBA is stored in the Drift Table entry 332 that corresponds to the Drift Buffer entry. The Drift Table 330 stores the VBA and corresponding LBA. For example, a Drift Table entry indexes to a Drift Buffer entry and maps the VBA to a corresponding LBA. When data is written to the Drift Buffer, the VBA field in the LVT 370 points to the Drift Table entry 372 using a Drift Table Index, instead of the VBA. When a read operation is processed, and the entry in the LVT corresponding to the LBA has a Drift Buffer Index Valid bit that is set indicating that the data is in the Drift Buffer, the system uses the Drift Table to identify the Drift Buffer entry and reads the data from the corresponding Drift Buffer. In that circumstance where the Drift Buffer Index Valid bit is set, in an embodiment, the LVT does not return the VBA. The Drift Table 330 in an embodiment is smaller than the LVT 370 and can be DRAM on the controller 200 and/or media card 102/390. An example Drift Table entry 332 is shown in Table 2 below.

TABLE 2

Drift Table Entry

| Byte Offset | Bits | Description |
|---|---|---|
| 0x00 | 63:56 | ECC |
|  | 55:40 | CRC of user data (2B) |
|  | 39:32 | Host LUN (1B) |
|  | 31:0 | Host LUN offset (4B) |
| 0x08 | 63:56 | ECC |
|  | 55:32 | Timestamp, this value increments for each host write (7B-1b) |
|  | 0 | Logically Bad Indicator |
| 0x10 | 63:56 | ECC |
|  | 55:32 | Optional Index to Drift Buffer (3B). Only used if the Drift Buffer will also be used as a read cache. This Index allows a 4KB read page to be moved to the head of the Drift Buffer by only modifying two Drift Table entries, without copying the data. 31:0 VBA (4B) |
| 0x18 | 63:56 | ECC |
|  | 55:32 | Reserved (3B) |
|  | 31:0 | LBA (4B) |

When the data has aged out of the Drift Buffer, the VBA field from the Drift Table 330 is copied into the corresponding entry 372 in the LVT 370. The table structure of the Drift Table 330 and LVT 370 makes it easy to utilize the Drift Buffer to also be a read cache. When utilized as a read cache, the Drift Buffer would be populated on both writes and reads or read ahead. Also, the time that frequently utilized data remains in the Drift Buffer can be extended with a Drift Table 330 update, where data that is being utilized will remain in the Drift Buffer. For example, read hit data could be moved to the head of the Drift Buffer. In this manner, the time that frequently read data stays in the Drift Buffer can be extended.

FIG. 3 also shows VBA Free List 340. VBA Free List 340 has a number of entries 342. VBAs that are not actively storing data for an associated LBA are kept on the VBA Free list 340, and in an embodiment, are organized or prioritized based upon the wear level. When a write command requires a free VBA to store data, a free VBA is obtained from the VBA Free List 340. If the write command is for an LBA which has previously been written, then the previously used VBA (corresponding to previously used LBA) is added to the VBA Free List 340. The VBA Free List 340 may reside on the controller 200 and/or the media card 102/390. Table 3 below shows a free list entry in the VBA Free List 340, where the entries are indexed by the VBA.

TABLE 3

VBA Free List Entry

| Byte Offset | Bits | Description |
|---|---|---|
| 0x00 | 31:0 | VBAs of blocks on the free list. Container will be filled starting with address 0x00, and ending with address 0xFF8. |
| 0x04 | 31:0 |  |
| ... |  |  |
| 0xFF8 | 31:0 |  |
| 0xFFC | 31:0 | Next: ID of next container in free list |

Figure 4:
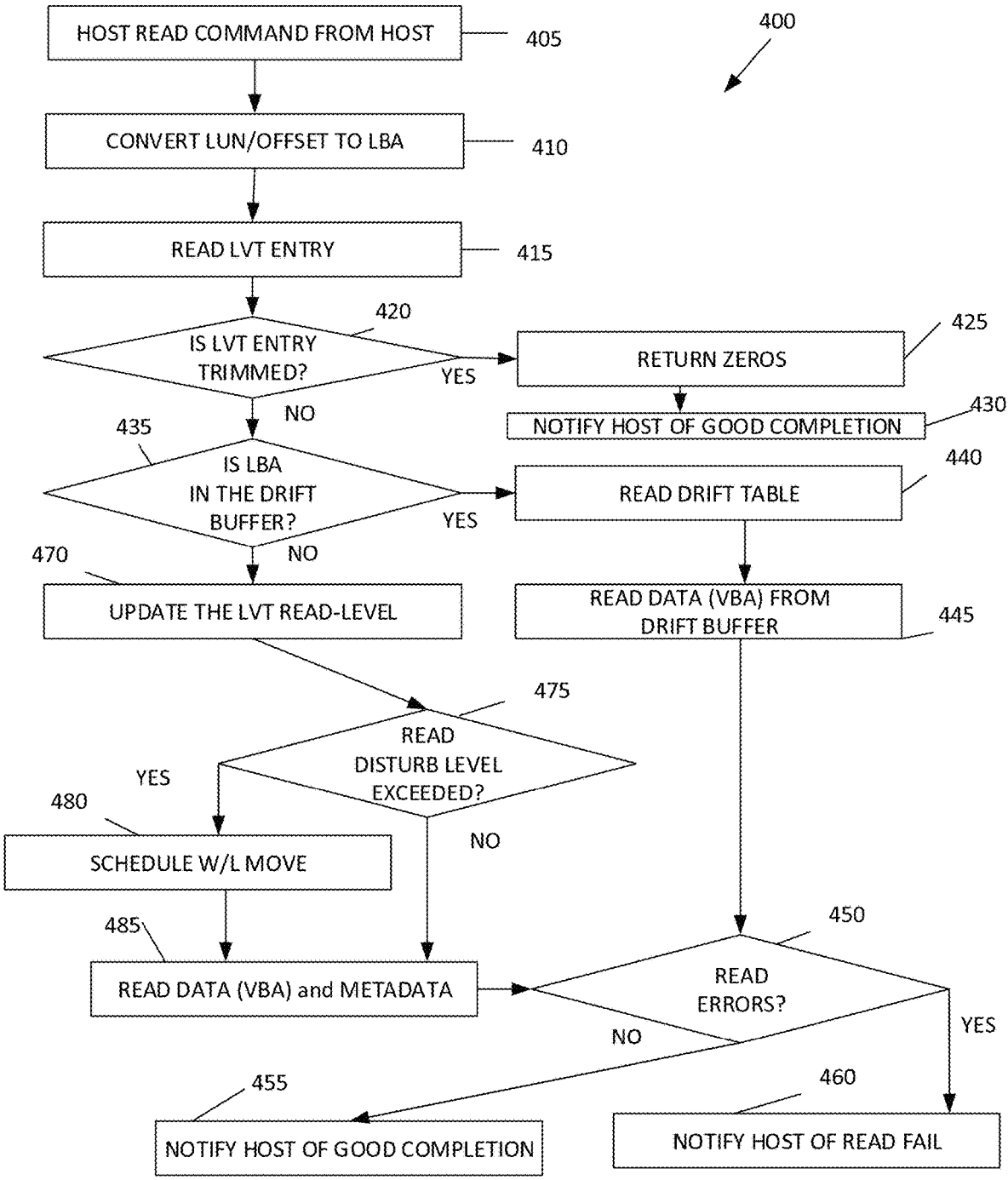
FIG. 4 is a flow chart of an embodiment of a method for performing a host read including translation of logical address in a memory system, such as for example, the memory system of FIGS. 2A and 2B.

Referring now to FIG. 4, a flowchart illustrating an example method 400 of processing a host read command, including, for example, converting and/or translating a logical address, e.g., a LBA, to a Virtual Block Address or VBA is disclosed. The flowcharts and block diagrams in the figures illustrate exemplary architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur in a different order than noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

At 405, a host read command is issued by the Host. The Host addresses the media card via a Logical Unit Number (LUN) and LUN offset as described earlier. The LUN and LUN offset at 410 are converted to a Logical Block Address or LBA. At 415, the Logical to Virtual Address conversion Table or LVT entry is read that corresponds to the LBA. That is, in an embodiment, the LVT is searched and a comparison is performed using the LBA converted from the LUN and LUN offset, and the entry in the LVT corresponding to that LBA is read. In one or more embodiments, it is determined at 420 whether the entry read from the LVT is trimmed or not. A trimmed entry in the LVT is where an entry is not available on the media and/or should not be read. In the embodiment of Table 1, bit 54 indicates whether entry 372 in the LVT is trimmed or not. If the entry read at 420 is trimmed (420: Yes), then at 425 zeros are returned, and at 430 the Host is notified of a good completion.

If at 420, the LVT entry that is read is not trimmed (420: No), then process 400 continues to 435 where it is determined whether or not the LBA is in the drift buffer (indexed in the Drift Table). So for example, for an LVT entry such as in the example of Table 1, bit 31, the Drift Buffer Index Valid bit, is read, and if bit 31 is set to 1, then the LBA is in the Drift Buffer. If the LBA is in the Drift Buffer (435: Yes), then at 440 read the entry in the Drift Table 330 that has the corresponding LBA. From the Drift Table the entry to the Drift Buffer is obtained, and at 445 the corresponding Drift Buffer is read. In the example of Table 1, if the LBA is in the drift buffer, than bits 20:0 in the LVT are an index into the Drift Table 330, and the corresponding entry in the Drift Table indicates what entry in the Drift Buffer to read. After reading the Drift Buffer at 445, the process continues to 450, where in one or more embodiments it is determined whether or not there were any read errors. If there are read errors (450: Yes), then at 460 the Host is notified of a read failure. If there are no read errors (450: No), then at 455 the Host is notified of a good completion, e.g., a good read completion.

If at 435 it is determined that the LBA is not in the Drift Buffer (435: No), then the LVT read level count is updated at 470. In the example LVT entry of Table 1, if the Drift Buffer Index Valid bit 31 is set at 0, then the bits 29:0 in the LVT refer to a VBA selecting a 5120 Byte block on the Storage Class Memory (SCM). In that example, the LBA is not in the Drift Buffer so the process 400 continues at 475 where it is checked whether or not the read level count for that entry (media address) exceeds a certain threshold. For example, it can be determined whether the read count level exceeds a threshold value, for example 10,000 reads. The threshold level can be set at different values that can be pre-programmed, or that can be altered during operations based upon a number of factors. If the read level does exceed the read level count (475: Yes), then at 480 a wear level move operation is scheduled where the data is moved to a new location, as discussed, for example, in this disclosure. After the wear level move of 480, the process 400 continues at 485 where the VBA and metadata are read from the LVT. If on the other hand it is determined at 475 that the read count threshold has not been exceeded (475: No), then the process continues to 485 where the VBA and metadata are read from the LVT. The process continues after 485 as shown in FIG. 4 where at 450 it is determined whether or not there are any read errors, and depending upon the whether there are any errors the Host is notified of a good completion at 455, or of a read failure at 460.

Figure 5:
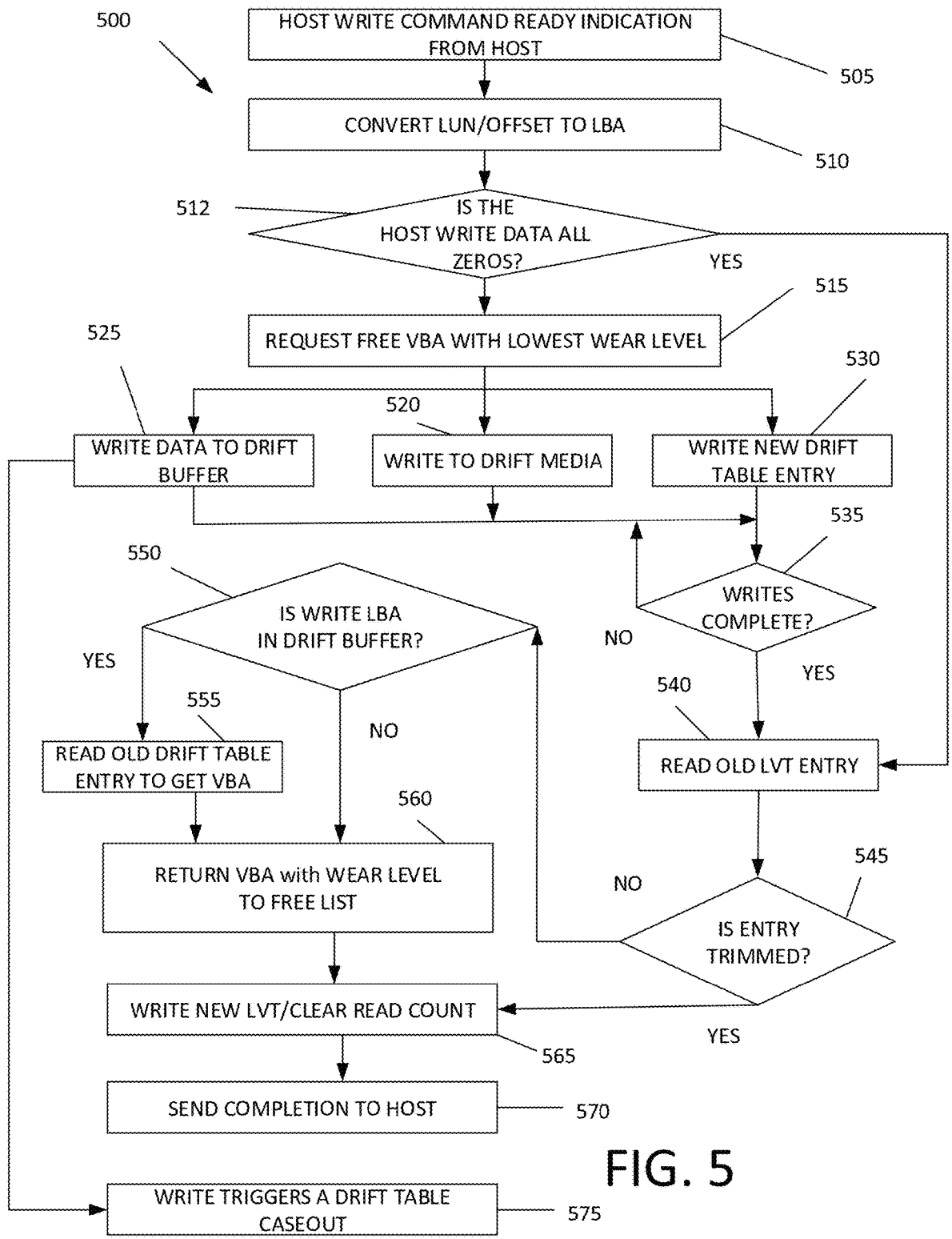
FIG. 5 is a flow chart of an embodiment of a method for performing a host write including translation of logical address in a memory system, such as for example, the memory system of FIGS. 2A and 2B.

Referring now to FIG. 5, a flowchart illustrating an example method 500 of processing a host write command including, for example, converting and/or translating a logical address, e.g., a LBA, to a Virtual Block Address or VBA is disclosed. At 505, a Host write command ready indication is issued by the Host. The address for the write command is issued as a LUN and LUN offset. At 510 the LUN and LUN offset are converted to a Logical Block Address or LBA. At 512, in one or more embodiments, it is determined whether or not the Host write data is all zeros. If the Host write data is all zeros (512: Yes), then the process skips to step 540 and no writing data to the media (or the Drift Buffer) is performed. If the Host write data is not all zeros (512: No), then the process continues to 515, where a request is made of the VBA Free List for an available entry. In one or more embodiments, the request is for the VBA with the lowest wear level, and/or the VBA Free List is configured to provide a VBA with the lowest wear level.

At 520, the data is written to memory, e.g., the media card. In addition, at 525 the data is also written to the Drift Buffer and at 530 a new Drift Table entry is written. That is in 525 and 530 data is written to an entry in the Drift Buffer, and the corresponding entry in Drift Table to which the entry in Drift Buffer is indexed is written with the VBA, the LBA, and optionally with the metadata shown in Table 2, or other data. In an aspect, CRC and other metadata are provided with the request from the Host. At 535, it is determined whether the write is complete. The process stays at 535 until the write is complete (535: Yes).

When the writing of the media, the Drift Buffer, and the Drift Table are complete, the process 500 continues to 540 where the old LVT entry is read. The LVT corresponding to the LBA is read at 540. In one or more embodiments, the old LVT entry is replaced with a new LVT entry. At 545 it is determined whether the old LVT entry is trimmed. If the LVT entry is trimmed, it indicates that the media should not be read, or is not available. In one or more embodiments, an entry in the LVT is marked as trimmed when the LBA has never been written, or was last written with zeroed data. If the old LVT entry is marked as trimmed (545: Yes), then the process continues to 565 where the new LVT is written. If at 545 the old LVT is not trimmed (545: No) then the process continues to 550 where it is determined if the LBA corresponding to the VBA that is being written is in the Drift Buffer. If the LBA at 550 is determined to be in the Drift Buffer (550: Yes), then at 555 the old Drift Table entry is read to get the VBA. Note that the entry in the Drift Table obtained at 555 is a different entry then the entry written in the Drift Table at 530 as the write process overwrites old entries in the Drift Table and the read entry is not updated. Continuing, at 560, the VBA is returned to the VBA Free List with the wear level indicated. If at 550 it is determined that the LBA is not in the Drift Buffer (550: No), then in an embodiment proceed directly to 560 where the VBA is returned to the Free List with its wear level data indicated so that the available VBA can be prioritized in the VBA Free List. After 560 the process proceeds to 565 where the new LVT is written.

In an embodiment, after 560 the process proceeds to 565 where the new LVT is written. The contents of the LVT written will depend upon prior processing. If the new LVT entry will be marked as trimmed because the Host write data is all zeros (512: Yes), the new LVT entry will contain a Trimmed Indicator, an invalid VBA, and a Drift Buffer Index Valid field that is cleared (set to zero). If the new LVT entry will not be marked as trimmed because the host write data is not all zeros (512: No), then the new LVT entry will contain a Drift Buffer Index Valid field set to indicate that the Drift Buffer Index is valid along with a valid Drift Buffer Index. When the new LVT entry is written, the read count field in the LVT entry is always cleared (set to zero). In one or more aspects, other metadata is written to the LVT entry at 565 including the wear level data. The write wear level in an aspect comes from the VBA Free List 340. After 565 the process continues to 570 where the Host is notified of the write completion.

It can be appreciated that in one or more embodiments a write operation can trigger a Drift Table cast-out 575. At the start the Drift Buffer has room for the next write operation. However, after the Drift Buffer is full, the oldest entry should be unallocated to make room for the next write operation. In one or more embodiments, the Drift Buffer may need to cast out or unallocate one or more entries in the Drift Buffer, and may cast out several entries ahead of the write pointer so there is room for the next write to the Drift Buffer. In an embodiment of casting out a Drift Buffer entry, the Drift Table is read to obtain the castout information, including the LBA of the one or more Drift Table entries to be removed from the Drift Buffer. Next, the LVT entry for the one or more LBAs to be removed from the Drift Buffer are read, and it is determined whether the LVT entry corresponding to the one or more LBAs to be cast out of the Drift Buffer are pointing to the Drift Table. If the LVT entry is pointing to the Drift Table (e.g., Drift Buffer Index Valid bit is set), then write the LVT entry to clear the Drift Buffer Index Valid bit and change the DBI in the LVT entry to the VBA. If the LVT entry is not pointing to the Drift Table, e.g., the Drift Buffer Index Valid bit is not set, then the LVT has already been updated and no updating of the LVT entry is necessary.

Figure 6B:
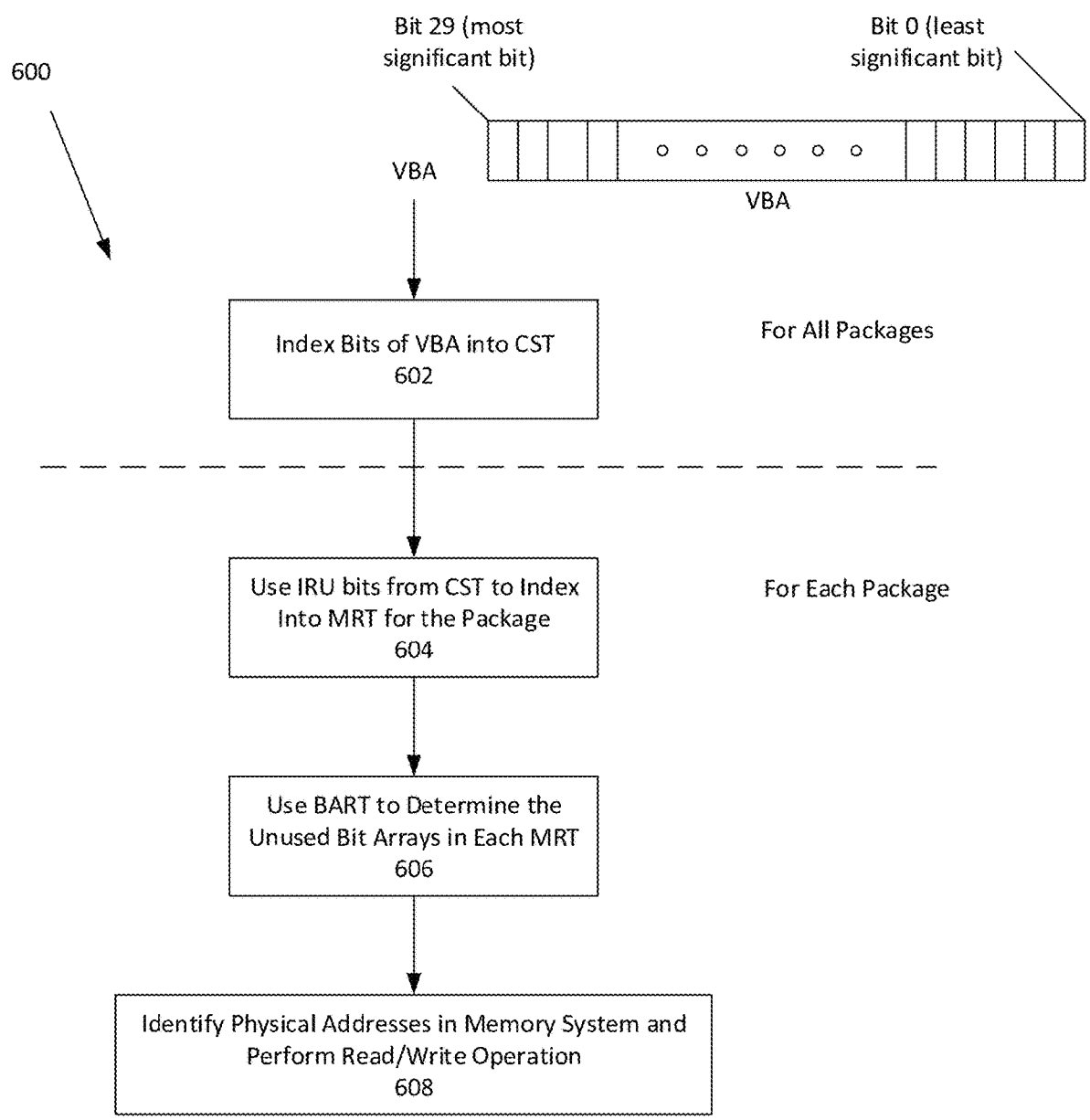
FIG. 6B is a flowchart illustrating an example method for translation of a virtual block address to a physical address of the memory system of FIGS. 2A and 2B.

Referring now to FIG. 6A, a block diagram over view of the hardware and process involved in translating a virtual block address (VBA) to a physical address on the media card, and to FIG. 6B, a flowchart illustrating an example translation of a virtual block address (VBA) to a physical address indicating the appropriate bits for performing a read/write operation (byte-addressable) in the memory module/card 102 of FIGS. 1, 2A, and 2B is illustrated. The flowcharts and block diagrams in the figures illustrate exemplary architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur in a different order than noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

It will be understood to those skilled in the art that the VBA may be derived from a logical block address (LBA) received from the host using the method and structures described above, and in one or more embodiments any now or hereafter known methods. The flowchart of FIG. 6B is based on the assumption that the lowest addressable granularity of the memory module/card 102 of FIG. 1 is 16 bytes, and the memory module/card 102 includes 24 packages, 8 or 16 dies per package, 16 MRU groups per die, 64 MRUs per MRU group, 128 bit arrays per MRU (4 of which are spare), 1 million bits in each bit array, and 1 million pages per MRU (each page including 128 bits, i.e., 16 bytes). It will be appreciated that the process of FIG. 6B can be utilized for other memory system configurations.

The flowchart further assumes that the read/write operation is performed for data that includes 4K byte size blocks of data. As such, each read/write operation is performed for a total of 5120 bytes of data that includes the 4K bytes of data received from the host, ECC bytes, and some metadata. Given that the lowest addressable granularity of the memory module/card 102 is 16 bytes, the 5120 bytes of data may be stored in 320 discrete pages (16 bytes each, with 15.5 bytes used to hold actual data) across the memory module/card 102. It will be understood that the 320 discrete pages should be distributed evenly across the memory module/card 102 for wear leveling. Therefore, the translation process translates the VBA to 320 discrete pages of the physical address in the memory module/card 102 and the VBA is representative of such 320 discrete pages. The VBA is a 30 bit address and the lower 20 bits (i.e., least significant bits) of the VBA are ignored during translation because they represent a collection of 1 million 4K byte sized blocks that all have the same upper 10 bits (the most significant bits) of the VBA (collectively, the 1 million 4K byte blocks are referred to as a virtual repair unit (VRU) represented by the VBA). It should be noted that the example embodiment disclosed herein uses a 30 bit VBA for addressing a 4 TB media card. However, the disclosure is not so limiting and other size addresses may be similarly used for different media cards. The upper 10 bits may be used to identify a VRU using the chip select table, as discussed below. The number of VRUs is configured based on the actual media card (e.g., if the actual storage capacity of a 4 TB media card is about 2.5 TB, the number of VRUs is 614). For different media cards, different upper bits may be used to identify a VRU using the chip select table (CST).

Figure 6C:
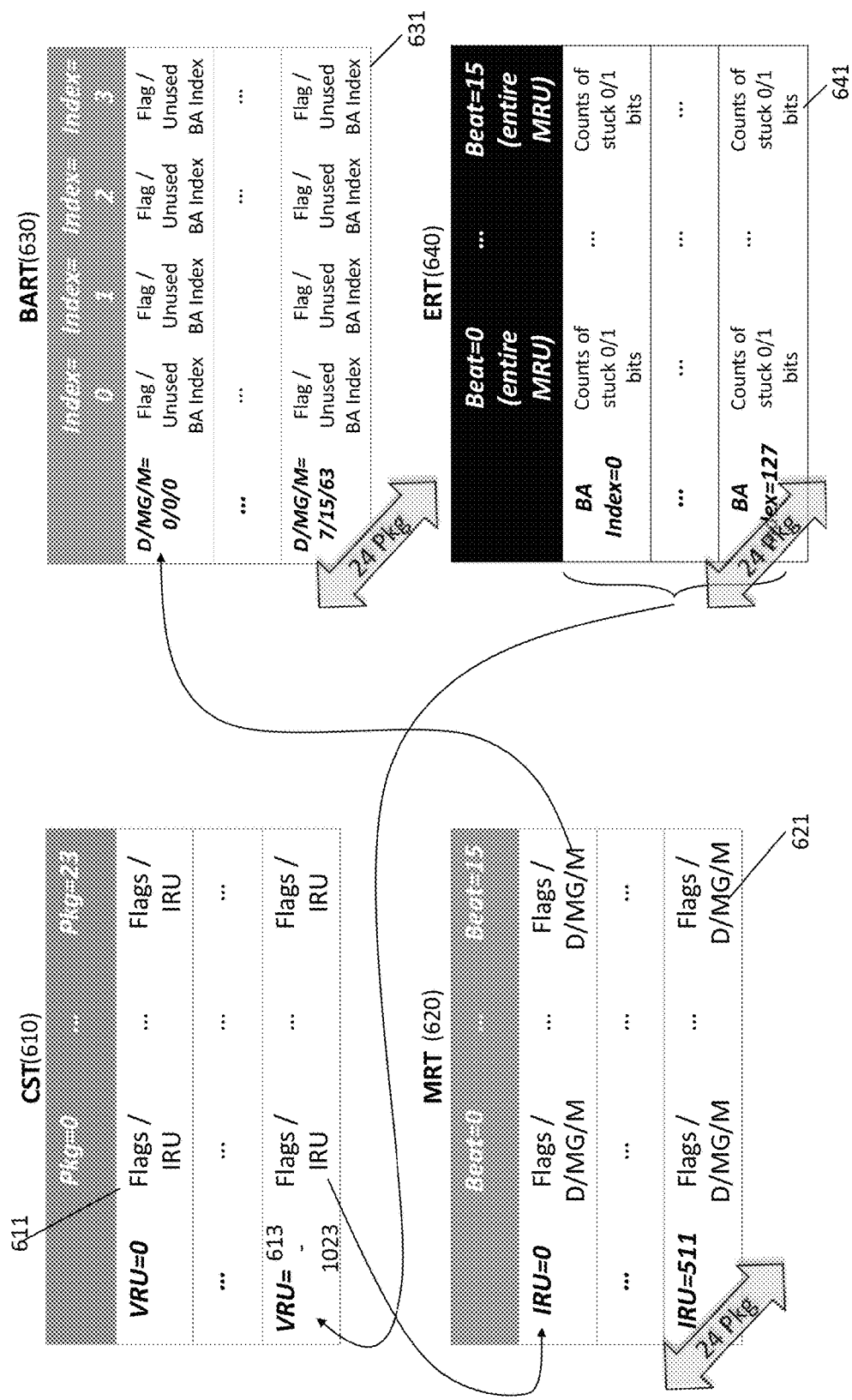
FIG. 6C illustrates example translation tables for use in translation of a virtual block address to a physical address of the memory system of FIGS. 2A and 2B.

As shown in FIG. 6C, the translation of a VBA to a physical address is a multiple layer lookup that includes at least three lookup tables—a chip select table (CST)(e.g., same for all 24 packages), 24 media repair tables (MRT) (e.g., one for each package), and 24 bit array repair tables (BART)(e.g., one for each package). At 602, the VBA is indexed into the CST. As discussed above, in one or more embodiments, the lower 20 bits of the VBA representing a VRU are ignored during translation and only the upper 10 bits of the VBA are indexed into the CST at step 602.

As shown in FIG. 6C, CST 610 includes columns indexed by the package number, e.g., Pkg 0-23, and rows indexed by the VRU number. The VRU number is identified using the upper (most significant) 10 bits of the VBA. Each entry 611 in the CST 610 includes a total of 16 bits: the least significant 9 bits for determining the intermediate repair unit (IRU) number (i.e., 9 IRU bits), the next 3 bits are reserved for future use, the next 1 bit indicating whether the VRU is to be scrubbed (i.e., a scrub bit), the next bit is a flag bit indicating whether the package is included (i.e., an included flag bit) in the VRU for performing a VBA read/write operation, the next bit indicating whether the package contains an IRU for which some or all of the MRUs have failed (i.e., a partially failed bit), and the final most significant bit (total 16 bits) indicating whether the package includes a complete spare IRU (i.e., a spare bit). Similarly, IRU's partially marked as failed and/or spare in an embodiment may not be used for a read/write operation.

As described above, the included flag bit of the CST entry 611 is indicative of whether or not a package will contain data for the VBA (i.e., read/write operation). For example, if the included flag bit value is "0" for a package, it will not contain data for the VBA read/write operation, and if the included flag bit value is "1" for a package, it will contain data for the VBA read/write operation (or vice versa). Out of the 24 packages on a media card, in an embodiment only 20 packages are used to perform the read/write operations, and 4 packages are spare packages for use as replacement of faulty packages by the media repair module 206. Since the 320 pages for storing a 5120 bytes size block of data is spread evenly across the memory module/card 102, during translation, the included flag bit of 20 packages will indicate that the corresponding package will contain data for the VBA read/write operation. Furthermore, each of the 20 packages will include 16 discrete pages (or beats) that will contain data to achieve an even distribution of data. As used herein, the term beat is used to describe a page in a package that will contain data for performing a read/write operation corresponding to the received VBA. These 16 beats for each package may be identified using the MRT and the BART, as discussed below. As such, during translation, the VBA is indexed into the CST at 602 and upper 10 bits of the VBA are used to identify a VRU number, and using the CST a corresponding included flag bit and IRU bits for each package.

Referring back to FIG. 6B, at step 604, for each package, the 9 IRU bits retrieved from the corresponding CST entry may be used to index into the MRT for that package. Specifically, for each of the 20 valid packages, the 9 IRU bits from the CST 610 are used to identify an IRU number (0-511), which is in turn used to index into the MRT 620.

As shown in FIG. 6C, the MRT 620 includes rows indexed by an IRU number and columns indexed by a beat number. Each entry 621 in the MRT 620 includes a total of 16 bits and determines the physical address of each beat on the package (total 16) that will contain data for performing the VBA read/write operation. The physical address is represented as a combination of die index (least significant 4 bits of the entry 621) in the package, the MRU group index (next 4 bits of the entry 621) in the die, and the MRU index (next 6 bits of the entry 621) in the MRU group that will include the beat (D/MG/M). Entry 621 also includes a failed bit (bit next to the most significant bit) indicating if the page represented by the D/MG/M has previously been declared as failed, and a spare bit indicating if the page represented by the D/MG/M has previously been declared as an individual spare (if the entire IRU is a spare, the MRUs will not be marked as spare in entry 621). Failed and/or spare pages may not be used for a read/write operation. The MRT 620 for each package, therefore, returns 16 physical addresses for beats in each package that may contain data for performing the read/write operation for the VBA.

As discussed above, an MRU includes 128 bit arrays out of which four are reserved as spare bit arrays, and each of the 1 million pages in the MRU takes 1 bit from each of the 124 remaining bit arrays. Therefore, at step 606, the BART 630 may be used to determine the indexes corresponding to the 124 bit arrays in each MRU of the above physical address from which the corresponding beat will take bits for performing the VBA read/write operation. As shown in FIG. 6C, each row of the BART 630 may be indexed using the D/MG/M identification from the MRT 620, and each column of the BART 630 is indexed by 0-3 since each MRU includes 4 unused bit arrays. Each entry 631 of the BART 630 includes 8 bits—7 least significant bits indicating one of the four unused bit arrays (out of 128 bit arrays) for the MRU of that row, and the most significant bit being reserved for future use. The 124 bit arrays from which bits will be taken by a beat may be determined by excluding the unused bit arrays from an MRU.

At step 608, the system may use the 20 least significant bits of the VBA in conjunction with the physical address (D/MG/M) and the unused bit array indexes to perform the read/write operation at the appropriate memory cells, where the actual read/write operation may be performed according to the interface specifications of each particular SCM memory technology.

It should be noted that the unused bit array indexes of the BART 330 may be determined using an Error Rate Table (ERT) 640 created during a memory scrub process (described below with respect to FIG. 7). As shown in FIG. 6C, an ERT 640 of a package includes rows corresponding to 128 bit arrays and columns corresponding to MRUs in the package. Since one VRU is scrubbed at a time during the scrub process, the MRUs of the ERT 640 correspond to the VRU being scrubbed (discussed below). Furthermore, the scrub process described below targets 16 beats (i.e., MRUs) per package and updates an ERT for each package such that there are 16 MRUs in an ERT. Each entry 641 in an ERT includes the total number of stuck bits observed during a scrub process of a VRU. Since a VRU includes 1 million consecutive VBAs, the total number of stuck bits can be 2 million ((1 million stuck-at-0 and 1 million stuck-at-1, though not commonly both).

Referring now to FIG. 7, a flowchart illustrating an example scrub process of the memory module/card 102 is described. The scrub process may be performed for periodically rewriting data within a threshold period of time in order to ensure readability and accuracy of the data, for periodically inverting bits of the memory system to condition each memory cell for future programmability, and/or to test the memory system and gather statistics corresponding to stuck fault failures (which may in turn be used to initiate media repair actions). In certain embodiments, the scrub process may be performed on one VRU at a time (in a round robin manner and/or upon occurrence of a trigger event) by taking the 1 million consecutive VBAs corresponding to the VRU being scrubbed out of service by disabling any further read/write operations from the VRU.

During a scrub process, at 702, the system identifies a VRU to be scrubbed. In one or more embodiments, the scrub process for each VRU may be performed periodically and in a round robin manner (e.g., every 24 hours) and/or upon occurrence of a trigger event (e.g., detection of a memory error such as an asynchronization memory error, detection that a memory operation requires higher levels of ECC correction, or the like). The scrub process for the VRUs may be scheduled such that the complete memory module/card 102 may be scrubbed during a threshold period of time (e.g., 24 hours, 48 hours, or the like).

At 704, the system in one or more embodiments determines whether the identified VRU is in service for performing read/write operations. If the identified VRU is in service for performing read/write operations (704: YES), the system may remove the VRU from use (706). The removal of a VRU (e.g., 1 million consecutive VBAs from service) may include, without limitation, removal of all 1 million VBAs of the identified VRU from the Free Lists (that identify the free areas of memory of specific size needed) of the memory system. Specifically, the system may not allow any VBA of the VRU from being placed on a Free List after being released by a write operation. Additionally and/or alternatively, the system may also remove any existing data from all of the VBAs of the VRU currently in use for storing data by migrating the data to another location, removal of the VBAs from the logical-to-virtual table (LVT) that keeps track of current values of the VBA, and/or removal of the VBAs from the drift buffer.

Upon removal of the identified VRU from service and/or if the identified VRU is determined to be not in service for performing read/write operations (704: NO), the system may initialize (e.g., assign zero values) counters for all ERTs corresponding to the identified VRU at 708. At 710, the system may issue write operations for each VBA of the identified VRU with pattern A. Examples of pattern A may include a string of all 1's (to detect all stuck-at-0 bits), a string of all 0's (to detect all stuck-at-1 bits), all 5's (to detect two adjacent bits stuck to each other), and/or the like. Once the pattern A write operation has been executed for all VBAs in the VRU, the system may issue read operations for each VBA of the identified VRU to determine the number of stuck-at-fault bits in the VRU at 712. For example, if pattern A includes a string of all 1's, the read operation may be used to determine the stuck-at-0 bits in the VRU and if pattern A includes a string of all 0's, the read operation may be used to determine the stuck-at-1 bits in the VRU. Other patterns may be used to identify the number of other stuck faults in the VRU (e.g., stuck-at-X, 2 or more bits stuck to each other, etc.).

At 714, the system may issue write operations for each VBA of the identified VRU with pattern B, where pattern B is different from pattern A. Examples of pattern B may include a string of all 1's (to detect all stuck-at-0 bits), a string of all 0's (to detect all stuck-at-1 bits), all 5's (to detect two adjacent bits stuck to each other), and/or the like. Once the pattern B write operation has been executed for all VBAs in the VRU, the system may issue read operations for each VBA of the identified VRU to determine the number of stuck-at-fault bits in the VRU at 716. For example, if pattern A includes a string of all 1's and is used to identify stuck-at-0 bits in the VRU, pattern B may include a string of all 0's to determine the stuck-at-1 bits in the VRU.

It should be noted that during the scrub process of a VRU, all 128 bit arrays of each MRU (not just 124 bit arrays) of the VRU are written/read by ignoring the BART during the translation process such that stuck-at faults may be detected on every bit array. Specifically, the translations of each of the 1 million VBAs of a VRU to physical page addresses are performed using only the CST and the MRT. Furthermore, translations during the scrub process also include the failed IRUs and/or spare IRUs. Each scrub process typically leads to the creation of 20-24 ERTs (for each package).

At 718, the system may update the ERT counters from step 708 based on the values of the determined stuck-at-0 bits and stuck-at-1 bits (i.e., update the counter to indicate the total number of stuck-at faults) for each bit array of each MRU of the VRU being scrubbed. At 720, the system may perform a media repair action (discussed below with respect to FIG. 8).

At 722, the system may return the VRU to service by, for example, inserting the 1 million VBAs of the VRU into the Free List. As discussed below, a VRU may not be returned to service if it is converted into spare IRUs during the media repair action.

Figure 8:
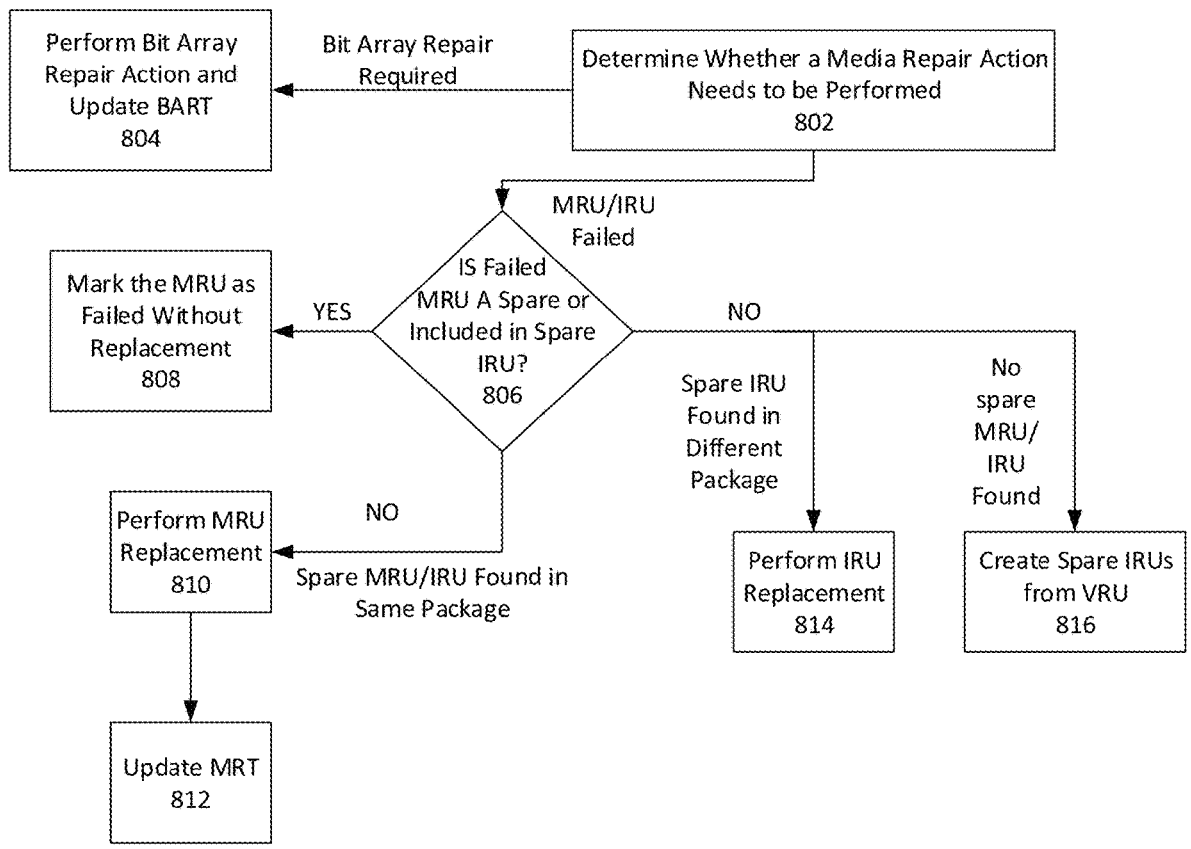
FIG. 8 is a flowchart illustrating an example method for memory repair action of the memory system of FIGS. 2A and 2B.

Referring now to FIG. 8, a flowchart illustrating an example media repair action performed during each scrub process of the memory system is described. As discussed above, during the scrub process, an ERT per package is constructed which indicates the number of stuck-at faults (e.g., stuck-at-1, stuck-at-0, etc.) for each of the bit array index/MRUs of the VRU being scrubbed. The system may analyze the counters in the ERT to perform a media repair action(s) as described in this FIG. 8. The media repair action may include bit array repair (almost always performed), MRU replacement, and/or IRU replacement.

At 802, the system may determine whether a bit array repair, an MRU replacement and/or an IRU replacement needs to be performed for the scrubbed VRU. In certain embodiments, the system may determine whether an MRU replacement and/or an IRU replacement needs to be performed for the VRU by identifying and analyzing the number of bad beats in the ERT.

A beat may be identified as a bad beat by analyzing the stuck-at bit counts for each of the bit arrays in the beat. Specifically, for each of the bit arrays of a beat, the system determines whether the number of stuck-at bit counts is greater than a first threshold ($T_H$), greater than a second threshold ($T_L$) but less than first threshold $T_H$, or is an acceptable number of stuck-at bits. The thresholds $T_L$ and $T_H$ are determined by the strength of the ECC. Example $T_H$ may be about 2000 to about 7000 bits per million bits, example $T_L$ may be about 200 to about 700 bits per million bits, and example acceptable number of stuck-at bits may be any value less than $T_L$ (e.g., less than 100 bits per million bits).

If no more than 4 beats have a number of stuck bits greater than $T_L$ (e.g., if a beat includes a 1 bit array having the number of stuck-at bit counts greater than $T_H$ and 3 bit arrays having the number of stuck-at bit counts greater than $T_L$), then the system may perform only bit array repair as discussed below. FIG. 9A illustrates an example ERT created after a VRU scrub that indicates a bit array repair is required.

Additionally and/or alternatively, if some beats (but not all and/or less than a threshold number) include more than 4 bit arrays having the number of stuck-at bit counts greater than $T_H$ and/or more than 11 bit arrays having the number of stuck-at bit counts greater than $T_L$, then the system may determine that the beat is a failed MRU. The system may perform MRU replacements for such failed MRUs in addition to bit array repair. FIG. 9B illustrates an example ERT created after a VRU scrub that indicates an MRU replacement is required.

If all or a certain threshold number of beats in an ERT for a package are bad (i.e., more than 4 bit arrays having the number of stuck-at bit counts greater than $T_H$ and/or more than 11 bit arrays having the number of stuck-at bit counts greater than $T_L$), then the system may determine that the IRU including the bad beats has failed. The system in one or more embodiments then performs IRU replacement for such failed IRUs in addition to bit array repair. An IRU replacement may also be performed if no spare MRUs exist in the package that includes the failed MRU that needs replacement. FIG. 9C illustrates an example ERT created after a VRU scrub that indicates an IRU replacement is required.

The numbers of bit arrays are provided as an example only and other numbers are within the scope of this disclosure for determining whether a bit array repair, an MRU replacement and/or an IRU replacement needs to be performed for VRU.

At 804, if a bit array repair is required, the system according to an aspect performs a bit array repair action by excluding the worst bit arrays from being used during a read/write operation. The system may first identify for each MRU in the ERT (i.e., column), the worst 4 bit arrays and their corresponding indexes by analyzing the total number of stuck-at faults observed for each bit array. The worst 4 bit arrays are bit arrays with the highest number of stuck-at-faults observed during the scrub process. The system may then update and save the BART corresponding to the ERT to include the worst 4 bit array indexes as the unused bit array indexes for that MRU. If more than 4 bit arrays are bad, the system may invoke an ECC to perform media repairs.

At 806, if an MRU/IRU replacement is required for a failed MRU, the system according to an aspect determines whether the failed MRU is a spare MRU and/or is included within a spare IRU. If the failed MRU is a spare MRU and/or is included within a spare IRU (806: YES), the system may mark the MRU as failed MRU (and not spare) without replacement (808). However, if the failed MRU is not a spare MRU and is not included within a spare IRU (806:

NO), then the system according to an embodiment performs an MRU replacement (810) and updates the MRT accordingly (812). It should be noted that a spare MRU may be considered as a candidate for replacement of a failed MRU only if performance of the MRU will not be degraded because performance degradation can result from the improper ordering of D/MG/M values within the beats of an IRU.

The system in an aspect performs MRU replacement (810) by first searching for spare MRUs in the same package as the failed MRU that needs to be replaced. If no spare MRUs are found, the system in an embodiment also searches for spare IRUs in the same package and divides the spare IRU into spare MRUs. The spare MRU and/or IRU in the same package can then be used to replace the failed MRU and/or the IRU including the failed MRU. The system in an embodiment converts the good MRUs (i.e., MRUs that don't need replacement) of the IRU being replaced to spare MRUs. Upon replacement, in one or more embodiments, the system updates the MRT for that package to swap the physical addresses of pages in the failed MRU or IRU (i.e., the D/MG/G) with that of the spare MRU or IRU.

However, if the package including the failed MRU does not include spare MRUs or IRUs, then in one or more embodiments the system replaces the whole IRU with a spare IRU in another package (814). The system according to an aspect converts the good MRUs (i.e., MRUs that don't need replacement) of the IRU being replaced to spare MRUs. Upon replacement, the system, in an embodiment, updates the CST to swap the IRU in-use with the spare IRU as well as the spare/failed IRU indications in the CST. It should be noted that in an embodiment a spare IRU from the same package as the failed MRU/IRU is preferred over a spare IRU from another package for replacement.

If the system cannot find any spare MRUs or IRUs in any of the packages, in one or more embodiments it creates (816) spare IRUs from the VRU being scrubbed (and not return it into service), and marks the failed MRU as failed. The system updates the CST and the MRT in an aspect to indicate that the VRU has been used to create spare IRUs and cannot be used for read/write operations.

In one or more embodiments, the media may need to be refreshed, for example, once a day. During a refresh operation, the data in a VBA is copied to a new VBA, and then the old VBA is written a first time to all "1s" and then written a second time to all "0s", before the old VBA is put back in service.

While the illustrative embodiments described above are preferably implemented in hardware, such as in units and circuitry of a processor, various aspects of the illustrative embodiments and/or techniques may be implemented in software as well. For example, it will be understood that each block of the flowchart illustrations in FIGS. 4-8, and combinations of blocks in the flowchart illustration, can be implemented by computer program instructions. These computer program instructions may be provided to a processor or other programmable data processing apparatus to produce a machine, such that the instructions which execute on the processor or other programmable data processing apparatus create means for implementing the functions specified in the flowchart block or blocks. These computer program instructions may also be stored in a computer-readable memory or storage medium that can direct a processor or other programmable data processing apparatus to function in a particular manner, such that the instructions stored in the computer-readable memory or storage medium produce an article of manufacture including instruction means which implement the functions specified in the flowchart block or blocks.

Accordingly, blocks of the flowchart illustration support combinations of means for performing the specified functions, combinations of steps for performing the specified functions, and program instruction means for performing the specified functions. It will also be understood that each block of the flowchart illustration, and combinations of blocks in the flowchart illustration, can be implemented by special purpose hardware-based computer systems which perform the specified functions or steps, or by combinations of special purpose hardware and computer instructions.

One or more embodiments of the present disclosure may be a system, a method, and/or a computer program product. The computer program product may include a computer readable storage medium (or media) having computer readable program instructions thereon for causing a processor to carry out aspects of the present disclosure.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present disclosure may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present disclosure.

Aspects of the present disclosure are described herein with reference to flowchart illustrations and/or block diagrams of methods, apparatus (systems), and computer program products according to embodiments of the disclosure. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present disclosure. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Moreover, a system according to various embodiments may include a processor and logic integrated with and/or executable by the processor, the logic being configured to perform one or more of the process steps recited herein. By integrated with, what is meant is that the processor has logic embedded therewith as hardware logic, such as an application specific integrated circuit (ASIC), a field programmable gate array (FPGA), etc. By executable by the processor, what is meant is that the logic is hardware logic; software logic such as firmware, part of an operating system, part of an application program; etc., or some combination of hardware and software logic that is accessible by the processor and configured to cause the processor to perform some functionality upon execution by the processor. Software logic may be stored on local and/or remote memory of any memory type, as known in the art. Any processor known in the art may be used, such as a software processor module and/or a hardware processor such as an ASIC, a FPGA, a central processing unit (CPU), an integrated circuit (IC), a graphics processing unit (GPU), etc.

The corresponding structures, materials, acts, and equivalents of all means or step plus function elements in the claims below are intended to include any structure, material, or act for performing the function in combination with other claimed elements as specifically claimed. The description of the embodiments of the present disclosure has been presented for purposes of illustration and description, but is not intended to be exhaustive or limited to the embodiments in the form disclosed. Many modifications and variations will be apparent to those of ordinary skill in the art without departing from the scope and spirit of the disclosure. The embodiments and examples were chosen and described in order to best explain the principles of the disclosure and the practical application, and to enable others of ordinary skill in the art to understand the disclosure for various embodiments with various modifications as are suited to the particular use contemplated.

The programs described herein are identified based upon the application for which they are implemented in a specific embodiment of the disclosure. However, it should be appreciated that any particular program nomenclature herein is used merely for convenience, and thus the disclosure should not be limited to use solely in any specific application identified and/or implied by such nomenclature.

It will be clear that the various features of the foregoing systems and/or methodologies may be combined in any way, creating a plurality of combinations from the descriptions presented above.

It will be further appreciated that embodiments of the present disclosure may be provided in the form of a service deployed on behalf of a customer to offer service on demand.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A memory system for storing data, the memory system comprising:
   one or more memory cards, each card having a plurality of storage chips, and each chip having a plurality of dies having a plurality of memory cells;
   a memory controller comprising a translation module, the translation module further comprising:
   a logical to virtual translation table (LVT) having a plurality of entries, each entry in the LVT configured to map a logical address to a virtual block address (VBA), where the VBA corresponds to a group of the memory cells on the one or more memory cards,
   wherein each entry in the LVT further includes a write wear level count to track the number of writing operations to the VBA mapped to that LVT entry, and a read wear level count to track the number of read operations for the VBA mapped to that LVT entry.

2. The memory system of claim 1, wherein the write wear level count in the LVT is programmable to have a write level threshold corresponding to the maximum number of writing operations to a VBA, and in response to a write operation exceeding the write level threshold in an LVT entry, the data in the memory card corresponding to the LVT entry that exceeds the write level threshold is moved to a new location on the memory card with a different VBA.

3. The memory system of claim 2, further comprising a VBA Free List identifying the VBAs available to write data to, and in response to a write operation, a new VBA is obtained from the VBA Free List.

4. The memory system of claim 3, wherein the system is configured to obtain a new VBA from the VBA Free List based upon the wear level count.

5. The memory system of claim 1, wherein the read wear level count in the LVT is programmable to have a read level threshold corresponding to a maximum number of reading operations of a VBA, and in response to a read operation exceeding the read level threshold in a LVT entry, the data in the memory card corresponding to the LVT entry that exceeds the read level threshold is written to a new location on the memory card with a different VBA.

6. The memory system of claim 5, further comprising a VBA Free List identifying the VBAs available to receive write data, and in response to a read operation exceeding the read level threshold for a LVT entry, a new VBA is obtained from the VBA Free List, and the data in the memory card corresponding to the LVT entry that exceeds the read level threshold is written to the new location on the memory card with the different VBA.

7. The memory system of claim 6, wherein the system is configured in response to a read operation exceeding the read level threshold to obtain a new VBA from the VBA Free List based upon the wear level count.

8. The memory system of claim 1, further comprising a Drift Buffer having a plurality of entries to temporarily store data, and a Drift Table having a plurality of entries, each Drift Table entry configured to index to one of the plurality of entries in the Drift Buffer, each entry of the Drift Table mapping a Drift Buffer Index to a VBA, wherein the system is configured, in response to writing data to the memory card, to also write the data to an entry in the Drift Buffer and further to write the VBA and the corresponding logical address into an entry in the Drift Table indexed to the corresponding entry in the Drift Buffer.

9. The memory system of claim 8, configured to read from the Drift Buffer if data corresponding to the VBA is present in the Drift Buffer.

10. The memory system of claim 8, wherein the Drift Buffer is a circular FIFO buffer contained on the memory card.

11. The memory system of claim 8, wherein each LVT entry comprises a field to indicate whether the Drift Buffer contains the data corresponding to that LVT entry, wherein the system is configured in response to a hit on an LVT entry where the LVT field indicates data is in the Drift buffer, the LVT entry points to an entry in the Drift Table.

12. The memory system of claim 8, further comprising a drift buffer index valid field in each LVT entry to indicate whether the Drift Buffer contains data corresponding to each respective LVT entry, and wherein the system is configured so that in response to a request to read data from the memory card, the system is configured to look-up the logical address in the LVT and in response to finding a LVT entry that corresponds to the logical address, the system checks the drift buffer index valid field, and in response to the drift buffer index valid field indicating the requested data is not in the Drift Buffer, the system utilizes the VBA from that LVT entry, and in response to the drift buffer index valid field indicating the requested data is in the Drift Buffer, the system reads the requested data from the Drift Buffer.

13. The memory system of claim 12, wherein the system is configured so that in response to the drift buffer valid field indicating that the requested data is in the Drift Buffer, the LVT points to an entry in the Drift Table, and the system utilizes the information in the Drift Table to obtain the requested data from a corresponding entry in the Drift Buffer.

14. The memory system of claim 8, wherein the system is configured so that in response to data being removed from a Drift Buffer entry, the LVT entry corresponding to the Drift Buffer entry from which data is removed is updated so that the LVT entry contains the VBA of the entry removed from the Drift Buffer.

15. The memory system of claim 1, further comprising a chip select table (CST) configured to identify one or more valid storage chips during translation for performing a memory access operation, and a media repair table (MRT) corresponding to each of the storage chips, each MRT configured to identify one or more storage dies during translation for performing a memory access operation.

16. The memory system of claim 1, further comprising a logical address conversion table configured to correspond a logical address expressed as a logical unit number (LUN) and a logical unit number offset (LUN offset) to a logical block address (LBA), and wherein the LVT is configured to map each LBA to a VBA.

17. A method for reading data from one or more memory cards, each memory card having a plurality of storage chips, and each storage chip having a plurality of dies having a plurality of memory cells, the method comprises:
   issuing a request for data located on the one or more memory cards;
   looking up a logical address for the requested data in a logical to virtual translation table (LVT) having a plurality of entries, each entry in the LVT mapping a logical address to a virtual block address (VBA), where the VBA corresponds to a group of memory cells in the one or more memory cards;

in response to locating the logical address of the requested data in an entry in the LVT, checking that LVT entry to determine whether the data is located in a Drift Buffer;

in response to determining the data is located within the Drift Buffer, reading the requested data from the Drift Buffer; and in response to determining the data is not located in the Drift Buffer, obtaining the VBA from the LVT entry corresponding to the logical address of the requested data and read the requested data in the memory card corresponding to the VBA.

18. The method of claim 17, further comprising in response to reading the requested data from the memory card updating a read level count field in the LVT.

19. The method of claim 18, further comprising comparing the read level count in the LVT entry to a read level threshold field in the LVT entry, and in response to the read level count being equal to or exceeding the read level threshold, write the data to be read to a new location on the one or more memory cards with a different VBA.

20. The method of claim 19, further comprising, in response to writing the data to be read to a new location on the one or more memory cards with a different VBA, update the LVT with the different VBA.

21. The method of claim 20, further comprising updating the VBA in a corresponding LVT entry in response to data being removed from the Drift Buffer.

22. The method of claim 17, further comprising moving an entry to the head of the Drift Buffer in response to reading data from the Drift Buffer.

23. A method of writing data to one or more memory cards, each memory card having a plurality of storage chips, and each storage chip having a plurality of dies having a plurality of memory cells, the method comprises:
    issuing a request to write the data to the one or more memory cards;
    obtaining an available VBA from a VBA Free List;
    write the data to the memory card location corresponding to the available VBA obtained from the VBA Free List;
    write the data to an entry in a Drift Buffer;
    write the VBA of the available VBA and the corresponding logical address to that available VBA to an entry in a Drift Table that corresponds to the entry in the Drift Buffer.

24. The method of claim 23, further comprising writing the corresponding LVT entry with the available VBA.

25. The method of claim 23, further comprising:
    writing into the LVT entry corresponding to the VBA that corresponds to the location on the memory card to which the data is written, a drift table index identifying the drift table entry corresponding to the Drift Buffer entry to which the data is written, and
    setting a bit to identify the data is in the Drift Buffer.

* * * * *